(12) United States Patent
Tanaka

(10) Patent No.: US 10,561,018 B2
(45) Date of Patent: Feb. 11, 2020

(54) CONNECTION STRUCTURE AND METHOD FOR MANUFACTURING CONNECTION STRUCTURE

(71) Applicant: Mikuni Electron Corporation, Saitama-shi, Saitama (JP)

(72) Inventor: Sakae Tanaka, Saitama (JP)

(73) Assignee: MIKUNI ELECTRON CORPORATION, Saitamashi-Shi, Saitama (JP)

( * ) Notice: Subject to any disclaimer, the term of this patent is extended or adjusted under 35 U.S.C. 154(b) by 0 days.

(21) Appl. No.: 16/004,281

(22) Filed: Jun. 8, 2018

(65) Prior Publication Data
US 2019/0239347 A1    Aug. 1, 2019

(30) Foreign Application Priority Data
Jan. 31, 2018  (JP) ................. 2018-015665

(51) Int. Cl.
| H05K 1/00 | (2006.01) |
| H05K 1/02 | (2006.01) |
| H05K 1/14 | (2006.01) |
| H05K 1/16 | (2006.01) |
| H01L 21/02 | (2006.01) |
| H01L 21/44 | (2006.01) |
| H01L 23/34 | (2006.01) |

(Continued)

(52) U.S. Cl.
CPC ............. *H05K 1/0306* (2013.01); *H05K 3/10* (2013.01)

(58) Field of Classification Search
CPC .. H05K 1/00; H05K 1/02; H05K 1/14; H05K 1/16; H01L 21/02; H01L 21/44; H01L 23/34; H01L 23/48; H01L 23/52

USPC ..... 174/251, 84 R, 254, 255, 259, 260, 261; 361/679.21, 820; 257/714, 737, 741, 753, 257/778; 428/137; 438/64, 66, 106; 136/244, 251, 256

See application file for complete search history.

(56) References Cited

U.S. PATENT DOCUMENTS

| 5,605,999 A * | 2/1997 | Chu .................... C08F 290/148 526/279 |
| 6,223,429 B1 * | 5/2001 | Kaneda ............... H01L 23/3121 174/260 |

(Continued)

FOREIGN PATENT DOCUMENTS

| JP | H10-256304 A | 9/1998 |
| JP | 2015-167106 | 9/2015 |

OTHER PUBLICATIONS

U.S. Office action for U.S. Appl. No. 16/004,295 dated Jan. 17, 2019.

(Continued)

*Primary Examiner* — Xiaoliang Chen
(74) *Attorney, Agent, or Firm* — Pearne & Gordon LLP

(57) ABSTRACT

A method for manufacturing connection structure, the method includes arranging conductive particles and a first composite on a first electrode located on a first surface of a first member, arranging a second composite on a region other than the first electrode of the first surface, arranging the first surface and a second surface of a second member where a second electrode is located, so that the first electrode and the second electrode are opposed to each other, pressing the first member and the second member; and curing the first composite and the second composite.

16 Claims, 16 Drawing Sheets

(51) Int. Cl.
  *H01L 23/48* (2006.01)
  *H01L 23/52* (2006.01)
  *H05K 1/03* (2006.01)
  *H05K 3/10* (2006.01)

(56) References Cited

U.S. PATENT DOCUMENTS

| | | | | |
|---|---|---|---|---|
| 6,365,840 B1* | 4/2002 | Honda | ............... | H01L 21/563 174/255 |
| 6,451,875 B1* | 9/2002 | Suga | ............... | C09J 9/02 257/E21.514 |
| 10,176,903 B2 | 1/2019 | Sekitani | | |
| 2003/0146499 A1* | 8/2003 | Kondo | ............... | H01L 23/3733 257/675 |
| 2004/0108133 A1* | 6/2004 | Sano | ............... | H01L 24/11 174/260 |
| 2004/0217342 A1 | 11/2004 | Kokubo | | |
| 2005/0155706 A1 | 7/2005 | Nishida | | |
| 2005/0173701 A1* | 8/2005 | Kawase | ............... | H01L 51/0022 257/40 |
| 2005/0176882 A1* | 8/2005 | Arifuku | ............... | C09J 4/06 524/730 |
| 2005/0211464 A1* | 9/2005 | Byun | ............... | H01L 24/29 174/259 |
| 2006/0033213 A1* | 2/2006 | Yim | ............... | H01L 24/29 257/753 |
| 2007/0045841 A1* | 3/2007 | Cho | ............... | H01L 23/3171 257/737 |
| 2007/0216023 A1* | 9/2007 | Nakatani | ............... | B23K 1/0016 257/714 |
| 2008/0145607 A1* | 6/2008 | Kajiwara | ............... | H01L 21/563 428/137 |
| 2008/0185717 A1* | 8/2008 | Sasaki | ............... | H01L 24/11 257/737 |
| 2008/0245248 A1* | 10/2008 | Takamatsu | ............... | B41F 17/007 101/217 |
| 2009/0026612 A1* | 1/2009 | Kang | ............... | H01L 24/83 257/738 |
| 2009/0115071 A1* | 5/2009 | Karashima | ............... | H01L 24/16 257/778 |
| 2009/0117687 A1* | 5/2009 | Hashimoto | ............... | H01L 21/486 438/106 |
| 2009/0126975 A1 | 5/2009 | Kondo | | |
| 2009/0141438 A1* | 6/2009 | Aita | ............... | G02F 1/13452 361/679.21 |
| 2009/0189254 A1* | 7/2009 | Kaneya | ............... | H01L 24/83 257/618 |
| 2009/0309220 A1* | 12/2009 | Katogi | ............... | C08G 18/3212 257/741 |
| 2010/0001411 A1* | 1/2010 | Sawada | ............... | H01L 24/11 257/778 |
| 2010/0038023 A1* | 2/2010 | Kho | ............... | B32B 17/06 156/247 |
| 2010/0133486 A1* | 6/2010 | Takai | ............... | B22F 1/0062 252/519.2 |
| 2010/0142359 A1* | 6/2010 | Sakata | ............... | G11B 19/2009 369/270.1 |
| 2010/0163289 A1* | 7/2010 | Ito | ............... | H05K 3/361 174/259 |
| 2010/0178487 A1* | 7/2010 | Arai | ............... | C08J 5/24 428/300.1 |
| 2010/0319974 A1* | 12/2010 | Ishizuka | ............... | H01L 24/16 174/260 |
| 2011/0176288 A1* | 7/2011 | Katogi | ............... | C09J 4/06 361/820 |
| 2012/0048606 A1* | 3/2012 | Izawa | ............... | C09J 133/04 174/259 |
| 2012/0085579 A1* | 4/2012 | Tatsuzawa | ............... | H05K 3/323 174/84 R |
| 2013/0134570 A1* | 5/2013 | Nishido | ............... | H01L 33/0095 257/680 |
| 2014/0026646 A1* | 1/2014 | Feldman | ............... | G01N 27/327 73/61.43 |
| 2014/0341242 A1* | 11/2014 | Murayama | ............... | C09J 11/04 372/36 |
| 2015/0114454 A1* | 4/2015 | Kim | ............... | H01L 31/0508 136/251 |
| 2015/0155405 A1* | 6/2015 | Jang | ............... | H01L 31/022441 136/256 |
| 2015/0208511 A1 | 7/2015 | Ishimatsu | | |
| 2015/0353781 A1 | 12/2015 | Namiki | | |
| 2016/0155717 A1 | 6/2016 | Saruyama | | |
| 2016/0286649 A1* | 9/2016 | Choi | ............... | H05K 1/0259 |
| 2016/0329295 A1 | 11/2016 | Yamaguchi | | |
| 2017/0115591 A1* | 4/2017 | Terada | ............... | G03G 15/0233 |
| 2017/0168198 A1* | 6/2017 | Kajiya | ............... | B32B 9/00 |
| 2017/0169914 A1 | 6/2017 | Sekitani | | |
| 2017/0336710 A1* | 11/2017 | Baron | ............... | G03F 7/091 |
| 2018/0063956 A1* | 3/2018 | Min | ............... | H01L 24/17 |
| 2018/0086950 A1* | 3/2018 | Kunimune | ............... | C08K 3/08 |
| 2018/0197657 A1* | 7/2018 | Tsukao | ............... | H01B 5/16 |

OTHER PUBLICATIONS

U.S. Office action for U.S. Appl. No. 16/004,302 dated Mar. 8, 2019.

U.S. Office Action for U.S. Appl. No. 16/004,295, dated Aug. 21, 2019.

U.S. Office action for U.S. Appl. No. 16/695,592 dated Dec. 31, 2019.

* cited by examiner

FIG. 11A
FIG. 11B
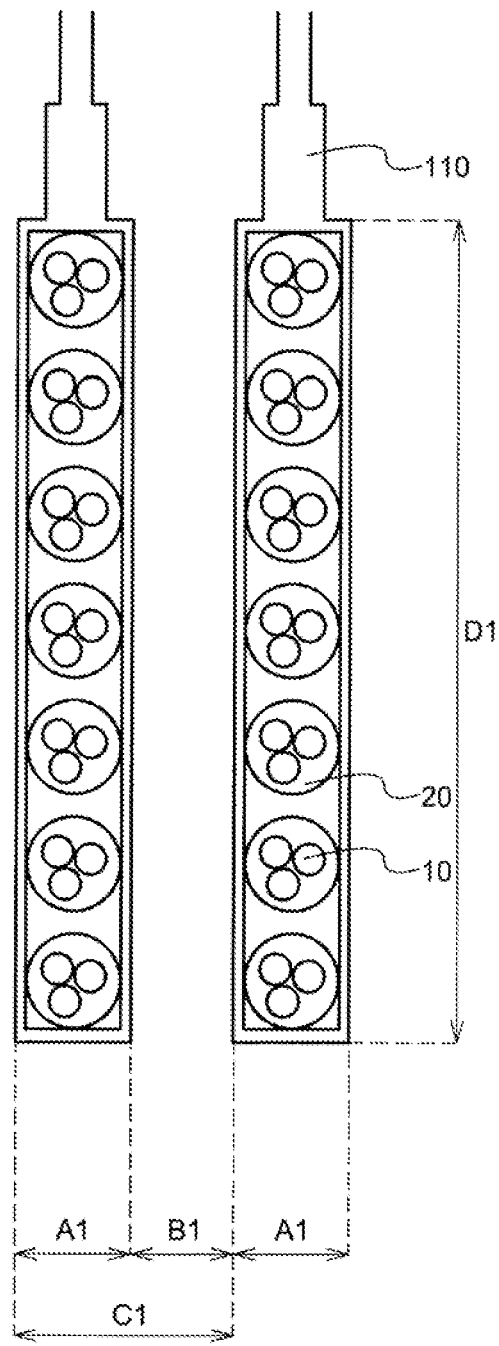
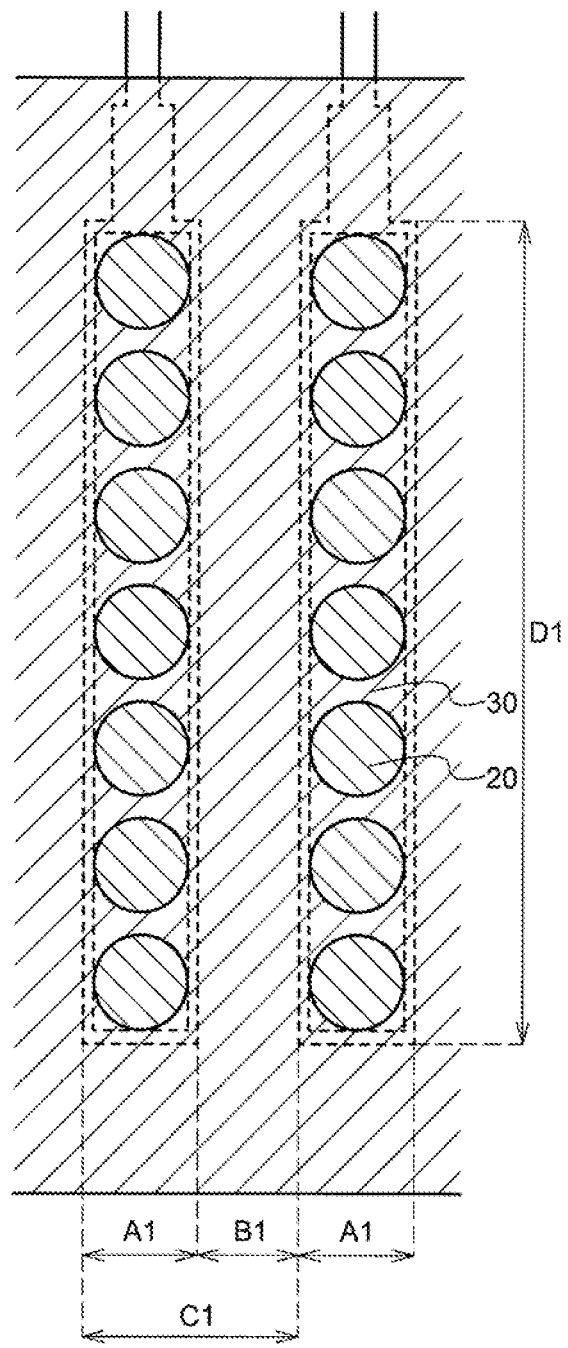
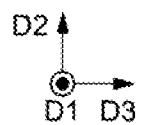

FIG. 12A
FIG. 12B
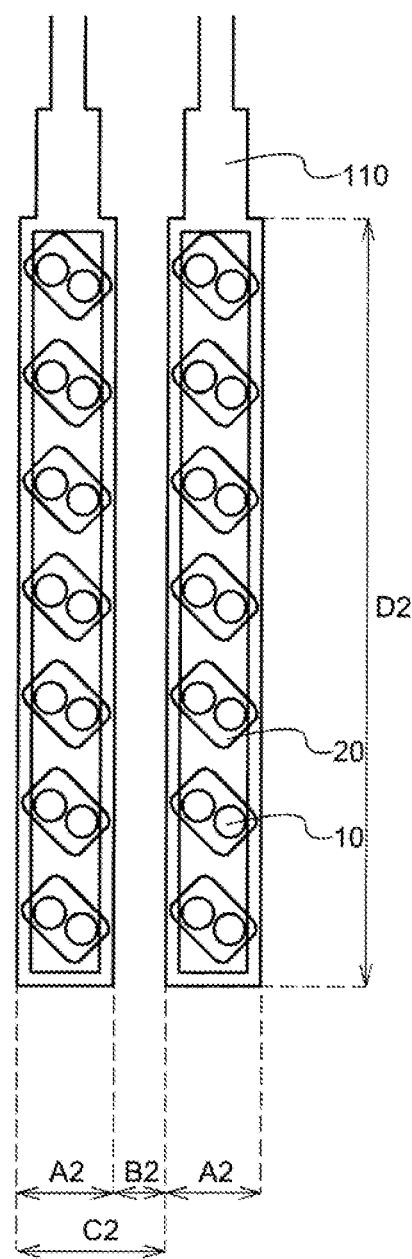
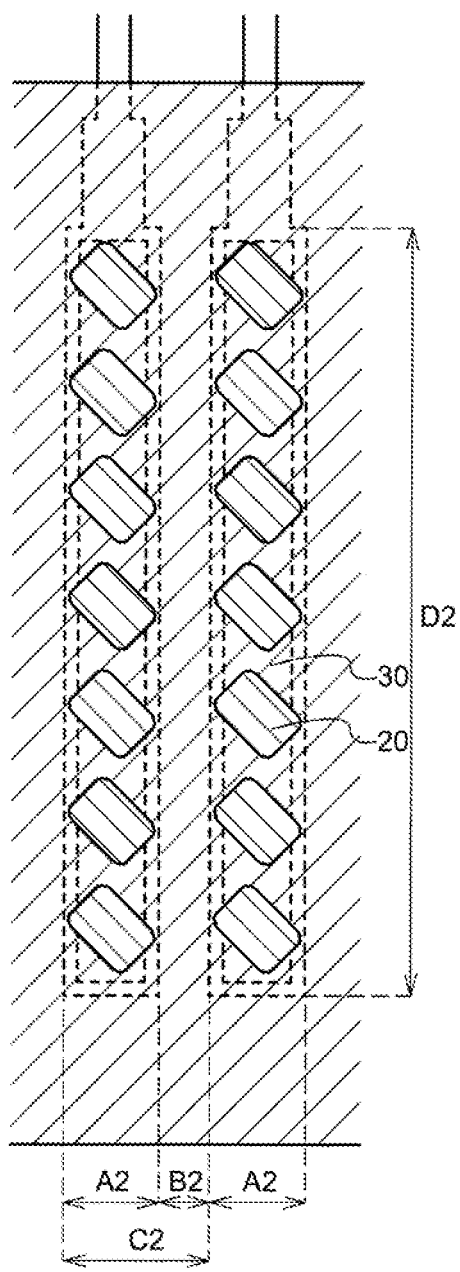
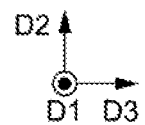

FIG. 13A
FIG. 13B
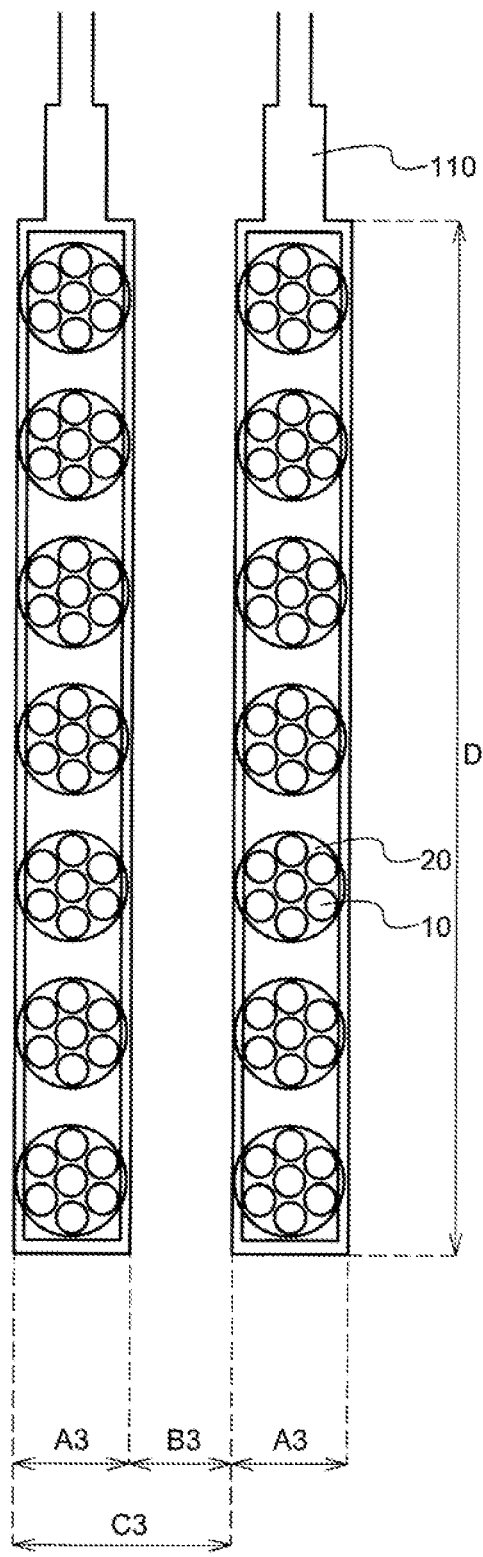
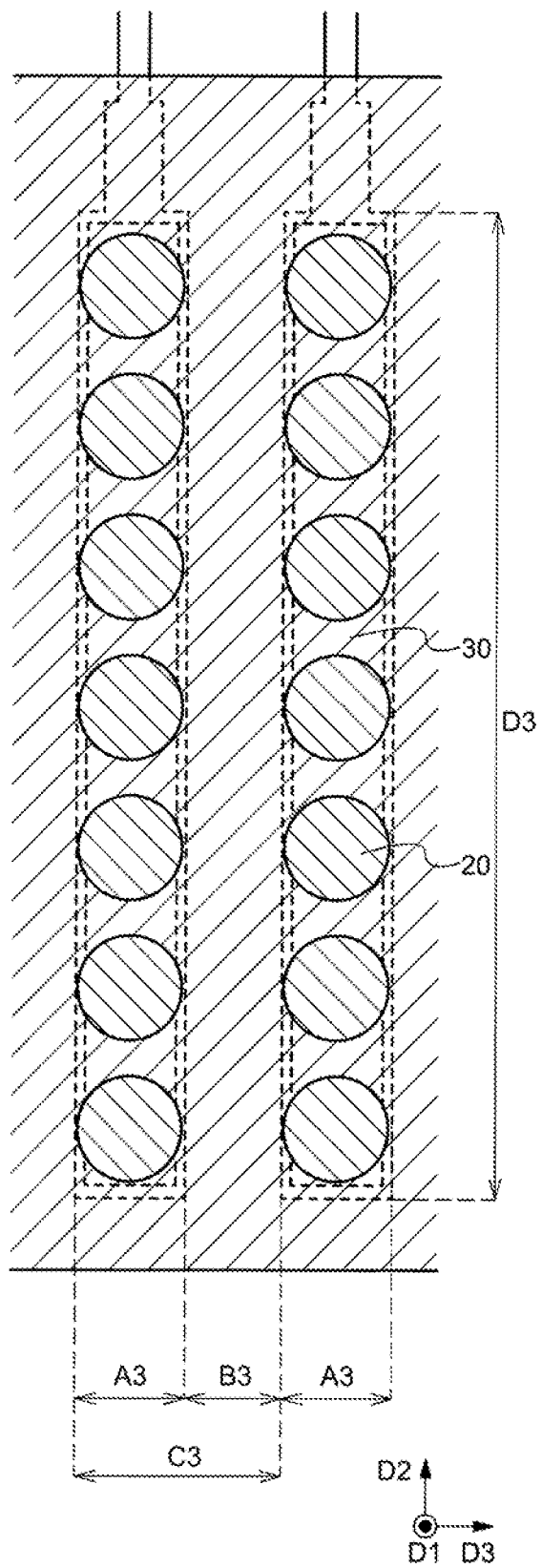

FIG. 14A
FIG. 14B
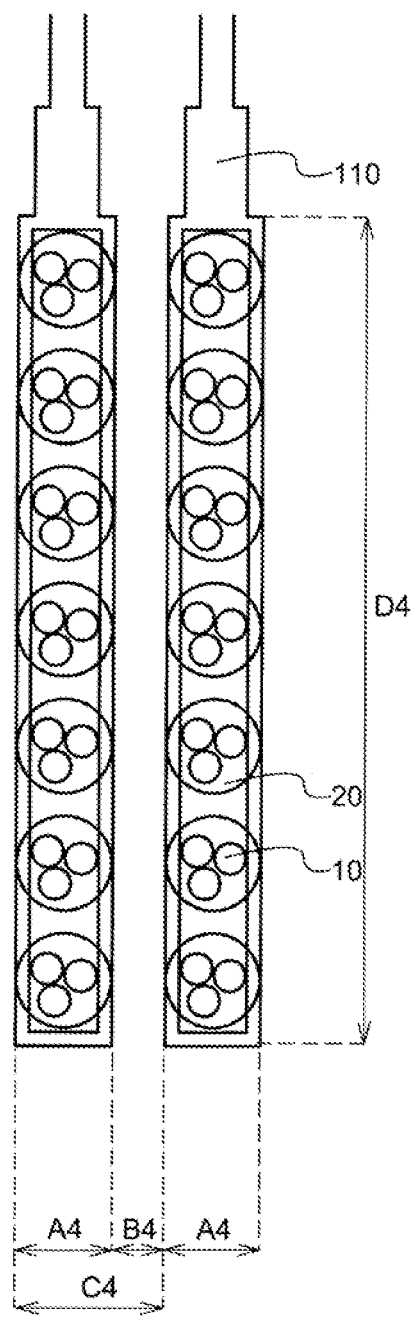
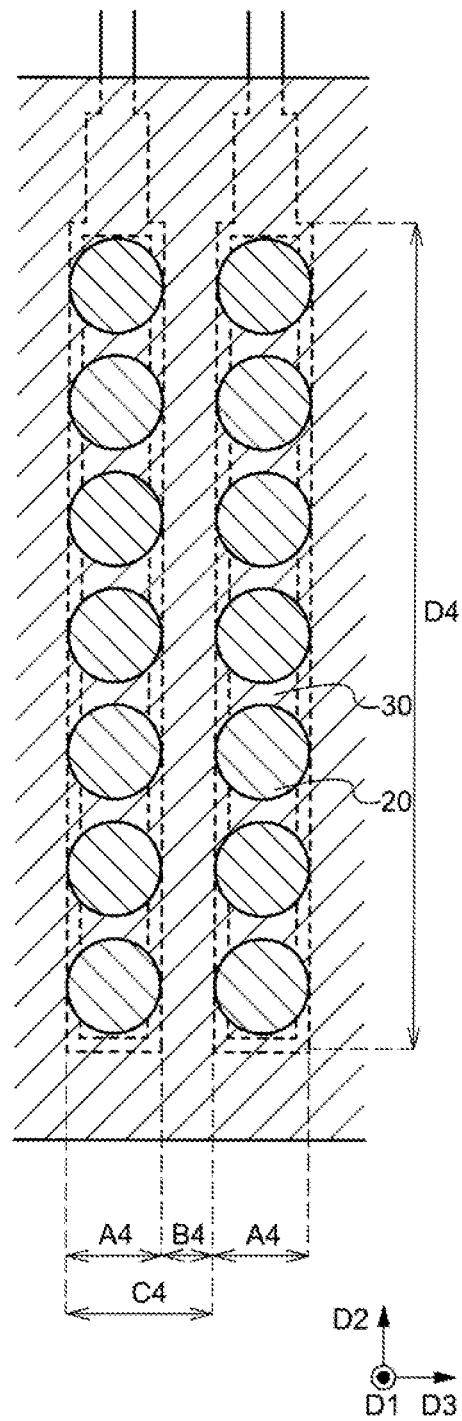

CONNECTION STRUCTURE AND METHOD FOR MANUFACTURING CONNECTION STRUCTURE

CROSS-REFERENCE TO RELATED APPLICATIONS

This application is based upon and claims the benefit of priority from the prior Japanese Patent Application No. 2018-015665, filed on Jan. 31, 2018, the entire contents of which are incorporated herein by reference.

FIELD

An embodiment of the present invention relates to a connection structure having a connection configuration of electrodes made of conductive composite and a method for manufacturing the connection structure.

BACKGROUND

In general, an anisotropic conductive films (ACF) containing conductive particles is widely used when an electronic component such as an integrated circuit is mounted on a substrate in COG (Chip on Glass) connection for connecting an integrated circuit directly to a glass substrate such as a liquid-crystal display or FOG (Film on Glass) connection for connecting a flexible printed board to a glass substrate of a flat panel display. The anisotropic conductive film is a thermosetting resin film with fine conductive particles dispersed therein. By interposing the anisotropic conductive film between aligned electrodes and performing thermal compression, the conductive particles positioned between the electrodes can form a conductive route. On the other hand, insulation properties of the thermosetting resin can reduce a short circuit between electrodes adjacent in a substrate surface direction. That is, the anisotropic conductive film has anisotropy of forming conductivity in a pressurizing direction (direction of both of the electrodes) and insulation properties are kept in a non-pressurizing direction (surface direction of the substrate). Having these characteristic, the anisotropic conductive film can collectively connect a plurality of electrodes provided on an integrated circuit, printed board, glass substrate, or the like, and can retain insulation properties of adjacent electrodes in the substrate surface direction.

However, with high fineness and high density of connection circuits in electronic devices in recent years, reliability of connection using the anisotropic conductive film matters. That is, when the size of an electrode as a connection target decreases, the number of conductive particles contributing to conductivity between paired electrodes decreases, and connection reliability between the electrodes may not be sufficiently obtained. Moreover, when a space between electrodes adjacent in the substrate surface direction is narrowed, both of the adjacent electrodes and the conductive particles may be in contact with each other, and insulation reliability may not be sufficiently obtained. Thus, for example, an anisotropic conductive film in a state with conductive particles dispersed by means such as application of a magnetic field and as being separated from other conductive particles is disclosed (for example, refer to Japanese Unexamined Patent Application Publication No. 2015-167106).

SUMMARY

A method for manufacturing connection structure according to an embodiment of the present invention, the method includes arranging conductive particles and a first composite on a first electrode located on a first surface of a first member, arranging a second composite on a region other than the first electrode of the first surface, arranging the first surface and a second surface of a second member where a second electrode is located, so that the first electrode and the second electrode are opposed to each other, pressing the first member and the second member, and curing the first composite and the second composite.

A connection structure according to an embodiment of the present invention includes a first member having a first surface, a first electrode located on the first surface, a second member having a second surface opposed to the first surface, a second electrode opposed to the first electrode and located on the second surface, a first resin and conductive particles arranged between the first electrode and the second electrode, and a second resin arranged between the first electrode and the second electrode and between a region other than the first electrode on the first surface and a region other than the second electrode on the second surface. The first resin is in contact with the first electrode, the second resin is in contact with the second electrode. The first resin and the second resin are different compositions from each other.

BRIEF DESCRIPTION OF DRAWINGS

FIG. 11A and FIG. 11B shows an example of the connection structure according to an embodiment of the present invention;

FIG. 12A and FIG. 12B shows an example of the connection structure according to an embodiment of the present invention;

FIG. 13A and FIG. 13B shows an example of the connection structure according to an embodiment of the present invention;

FIG. 14A and FIG. 14B shows an example of the connection structure according to an embodiment of the present invention;

DESCRIPTION OF EMBODIMENTS

Figure 1A:
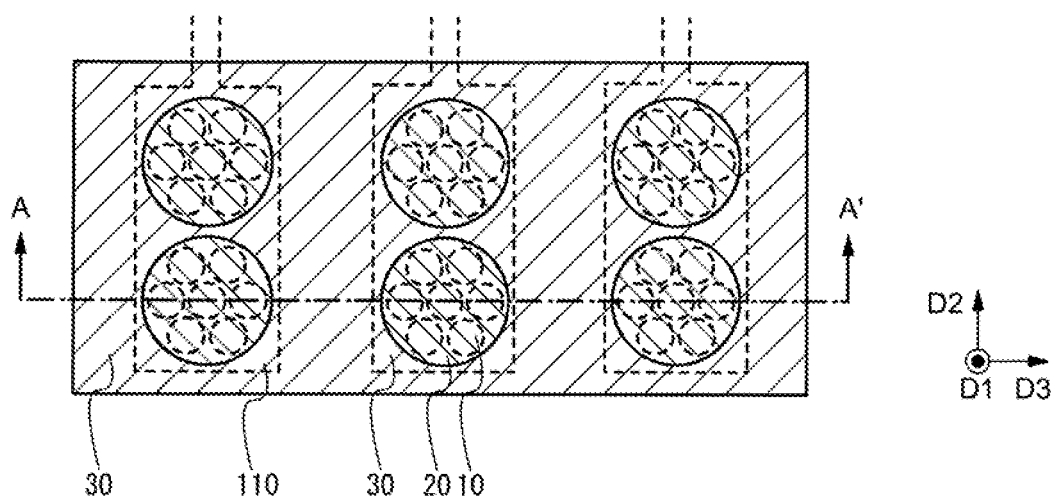
FIG. 1A to FIG. 1E shows a configuration of a connection structure according to an embodiment of the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way.

In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In the specification and the claims, an expression that a component is "on" the other component encompasses a case where such a component is in contact with the other component and also a case where such a component is above or below the other component, namely, a case where still another component is provided between such a component and the other component, unless otherwise specified.

In the anisotropic conductive film, since the sequence of the conductive particles is irregularly disturbed when substrates are subjected to thermal compression. Thus, it is difficult to sufficiently solve problems such as conduction failure due to the absence of conductive particles between the electrodes and a short circuit due to a contact of the conductive particles between the adjacent electrodes. Moreover, with a heat curing connection scheme, a dimensional change occurs in principle, due to a difference in coefficient of thermal expansion between upper and lower substrates, and a problem of deviation occurs between the electrodes formed on the upper and lower substrates. In several embodiments described further below, one aspect of a connection structure capable of solving one or plurality of these problems is described.

In the specification, a connection structure in COG connection for connecting an integrated circuit (second electronic component) to a glass substrate of a liquid-crystal display (a first electronic component) is described by way of example. However, the connection structure is not limited to this, and may be a connection structure in FOG connection for connecting a flexible printed board to a glass substrate of a flat panel display. In this case, the second electronic component may be a flexible printed board such as a TAB (Tape Automated Bonding) or COF (Chip on film).

First Embodiment

Configuration of Connection Structure

Figure 1B:
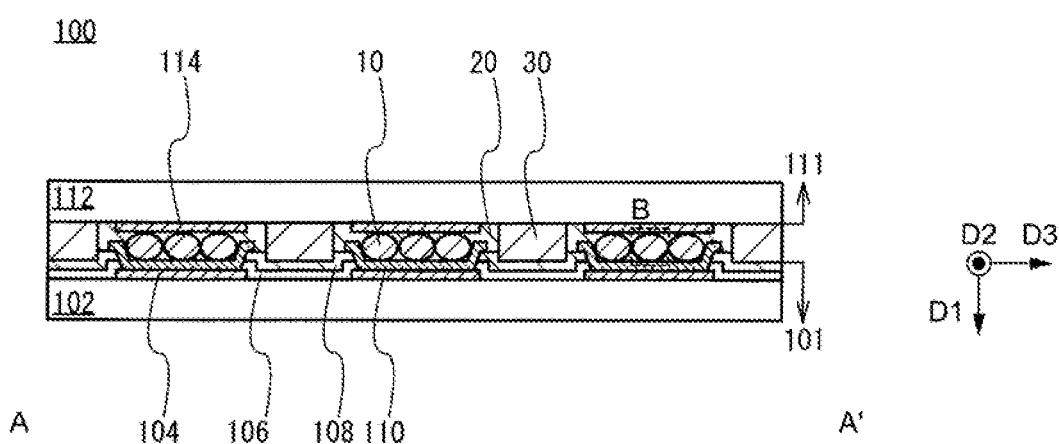
Figure 1C:
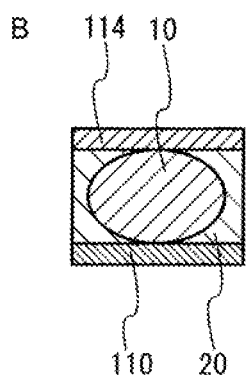

FIG. 1A to FIG. 1C shows the configuration of a connection structure according to one embodiment of the present invention. FIG. 1A is a plan view of the connection structure according to one embodiment of the present invention.

FIG. 1B is a sectional view along an A-A' line of FIG. 1A. FIG. 1C is an enlarged sectional view of a conductive particle in a region B of FIG. 1B.

As shown in FIG. 1A and FIG. 1B, a first electronic component 101 includes a terminal 104, a first insulating film 106, a second insulating film 108, and a first electrode 110 on a connection surface (first surface) of a first member 102. On the connection surface (first surface) of the first electronic component 101, a second electronic component 111 is mounted. The second electronic component 111 includes a second electrode 114 on a connection surface (second surface) of a second member 112. The first surface of the first electronic component 101 and the second surface of the second electronic component 111 are arranged so as to be opposed to each other. The connection structure 100 serves a function of physical connection between the first electronic component 101 and the second electronic component 111 and electrical connection between the first electrode 110 and the second electrode 114. The connection structure 100 includes the first member 102 having the first surface, the first electrode 110, the second member 112 having the second surface, the second electrode 114, conductive particles 10, a first resin 20, and a second resin 30.

A plurality of first electrodes 110 are arranged on the first surface of the first member 102. On the first surface of the first member 102, a second insulating film 108 is arranged in a region other than a region where the first electrodes 110 are arranged. A plurality of second electrodes 114 are arranged on the second surface of the second member 112 so as to correspond to the plurality of first electrodes 110. On the second surface of the second member 112, an insulating film may be arranged in a region other than a region where the second electrodes 114 are arranged.

The plurality of first electrodes 110 and the plurality of second electrodes 114 are arranged so as to be the first electrode 110 and the second electrode 114 are opposed to each other. The plurality of conductive particles 10 and the first resin 20 are arranged between the opposing first electrode 110 and second electrode 114. The plurality of conductive particles 10 are arranged in a surface direction (D2-D3 surface direction) between the opposing first electrode 110 and second electrode 114. One conductive particle 10 is arranged between the opposing first electrode 110 and second electrode 114 in an opposing direction (D1 direction) of the first electrode 110 and the second electrode 114. Each of the plurality of conductive particles 10 are in contact with the opposing first electrode 110 and second electrode 114. As shown in FIG. 1C, the conductive particle 10 is pressured and deformed in the opposing direction (D1 direction) between the first electrode 110 and the second electrode 114 by a method for manufacturing connection structure, which will be described further below. That is, a distance between the first electrode 110 and the second electrode 114 in the opposing direction (D1 direction) of the electrodes is substantially equal to the height of the conductive particle 10 in the opposing direction (D1 direction) of the electrodes. The height of the conductive particle 10 in the opposing direction (D1 direction) of the electrodes is pressured and deformed by approximately 10% to 40%. With a stress provided among the first electrode 110, the conductive particles 10, and the second electrode 114, the first resin 20 is eliminated at the contact part between the first electrode 110 and the conductive particle 10 and the contact part between the second electrode 114 and the conductive particle 10. Furthermore, even if a natural oxide film is formed on the first electrode 110, the conductive particle 10, or the second electrode 114 and its surface is insulated, the first electrode 110 and the second electrode 114 are pressure-welded with the conductive particle 10 interposed therebetween, thereby breaking the natural oxide film to form a conductive route. Furthermore, deformation of the conductive particle 10 can increase the area of contact between the first electrode 110 and the conductive particle 10 and the area of contact between the second electrode 114 and the conductive particle 10. This arrangement allows the conductive particle 10 to electrically connect the first electrode 110 and the second electrode 114.

The plurality of conductive particles 10 are dispersed in the first resin 20 between the first electrode 110 and the second electrode 114. Each of the plurality of conductive particles 10 are surrounded by the first resin 20 between the first electrode 110 and the second electrode 114 in the surface direction (D2-D3 surface direction). The first resin 20 is an insulating resin. Thus, the connection structure 100 has insulation properties in the surface direction (D2-D3 surface direction). However, the plurality of conductive particles 10 arranged between the opposing first electrode 110 and second electrode 114 and adjacent to each other in the surface direction (D2-D3 surface direction) may be in contact with each other. When the conductive particles 10 adjacent to each other in the surface direction (D2-D3 surface direction) are in contact with each other, the conductive particles 10 adjacent to each other are also electrically connected. This arrangement allows the conductive particles 10 to further reliably connect the opposing first electrode 110 and second electrode 114 electrically. The distance between the adjacent conductive particles 10 can be appropriately controlled according to the concentration of the conductive particles 10 mixed into a first composite 20', which will be described further below.

As shown in FIG. 1A and FIG. 1B, the plurality of conductive particles 10 and the first resin 20 are arranged on an upper surface of the first electrode 110 (or a lower surface of the second electrode 114). The plurality of conductive particles 10 and the first resin 20 are arranged in each certain region when viewed in the opposing direction (D1 direction) of the electrodes. In the present embodiment, the diameter of the conductive particle 10 when viewed in the opposing direction (D1 direction) of the electrodes is in a range between a value equal to or larger than 2 μm and a value equal to or smaller than 10 μm. The number of regions where the electrode particles 10 and the first resin 20 are arranged on the upper surface of one first electrode 110 (or the lower surface of one second electrode 114) is one or more, and the regions are preferably separated from each other by 5 μm or more. The number of conductive particles 10 in one region where the conductive particles 10 and the first resin 20 are arranged is preferably equal to or larger than one and equal to or smaller than seven. The number of conductive particles 10 arranged in one region is preferably seven, and more preferably three. When viewed in the opposing direction (D1 direction) of the electrodes, the number of conductive particles 10 arranged between the opposing first electrode 110 and second electrode 114 is preferably in a range between a value equal to or larger than seven per 400 μm$^2$ and a value equal to or smaller than twenty per 400 μm$^2$. When the number of conductive particles 10 is smaller than seven per 400 μm$^2$, the connection resistance value may tend to vary. When the number of conductive particles 10 is larger than twenty per 400 μm$^2$, the pressure deformation amount of the conductive particles 10 may be decreased due to load dispersion, causing the natural oxide film to be unable to be broken at a connection region and increasing connection resistance. Furthermore, when the number of conductive particles 10 is larger than twenty per 400 μm$^2$, the pressure deformation amount tends to change with time, and connection resistance tends to change with time. The above-described arrangement allows the conductive particles 10 to reliably connect the opposing first electrode 110 and second electrode 114, and can prevent a short circuit between the plurality of first electrodes 110 adjacent to each other in the surface direction (D2-D3 surface direction), between the plurality of second electrodes 114 adjacent to each other in the surface direction (D2-D3 surface direction), and between the first electrode 110 and the second electrode 114 not opposed to each other.

In the present embodiment, the shape of the region where the conductive particles 10 and the first resin 20 are arranged when viewed in the opposing direction (D1 direction) of the electrodes is a circle. However, the shape is not limited to this, and the region where the conductive particles 10 and the first resin 20 are arranged may have any shape satisfying the above-described condition.

In the present embodiment, the region where the conductive particles 10 and the first resin 20 are arranged is positioned at two locations on the upper surface of one first electrode 110 (or the lower surface of one second electrode 114). Also, seven conductive particles 10 are arranged in one region. However, this is not meant to be restrictive, and the number of regions where the conductive particles 10 and the first resin 20 are arranged on the upper surface of one first electrode 110 (or the lower surface of one second electrode 114) can be adjusted as appropriate to satisfy the above-described condition, depending on the area of the upper surface of the first electrode 110 (or the lower surface of the second electrode 114), the area of the region where the conductive particles 10 and the first resin 20 are arranged, and the size of the conductive particles 10. Also, the number of conductive particles 10 arranged in one region can be adjusted as appropriate to satisfy the above-described condition, depending on the size of the conductive particles 10 and concentration of the conductive particles 10 mixed into the first composite 20'.

The second resin 30 is further arranged between the first surface of the first member 102 and the second surface of the second member 112. The second resin 30 is arranged in a region not between the opposing first electrode 110 and second electrode 114. The second resin 30 is arranged between a region other than the first electrode of the first surface and a region other than the second electrode of the second surface. That is, the second resin 30 is arranged between the plurality of first electrodes 110 adjacent to each other in the surface direction (D2-D3 surface direction) and on the periphery thereof (between the plurality of second electrodes 114 adjacent to each other in the surface direction (D2-D3 surface direction) and on the periphery thereof). Furthermore, the second resin 30 is also arranged between the first electrode 110 and the second electrode 114 and in a region other than the region where the conductive particles 10 and the first resin 20 are arranged. The second resin 30 is arranged between the regions adjacent in the surface direction (D2-D3 surface direction) where the plurality of conductive particles 10 and the first resin 20 are arranged and on the periphery thereof. The second resin 30 is arranged between the regions where the plurality of conductive particles 10 and the first resin 20 adjacent in the surface direction (D2-D3 surface direction) are arranged and on the periphery thereof. In other words, the conductive particles 10 and the first resin 20 are surrounded by the second resin 30 in the surface direction (D2-D3 surface direction). That is, when viewed in the opposing direction (D1 direction) of the electrodes, the plurality of conductive particles 10 are surrounded by the first resin 20, and the first resin 20 is surrounded by the second resin 30. The second resin 30 is an insulating resin. Thus, the connection structure 100 has insulation properties in the surface direction (D2-D3 surface direction). This arrangement allows the second resin 30 to reliably insulate between the plurality of first electrodes 110 adjacent in the surface direction (D2-D3 surface direction), between the plurality of second electrodes 114 adjacent in the surface direction (D2-D3 surface direction), and between the first electrode 110 and the second electrode 114 not opposed to each other.

The boundary between the first resin 20 and the second resin 30 can be observed by cross-sectional observation of the connection structure 100. From a difference in composition between the first resin 20 and the second resin 30, the boundary between the first resin 20 and the second resin 30 can also be determined by a process/observation apparatus such as a Focused Ion Beam (FIB) process observation apparatus, a Scanning Electron Microscope (SEM), or a Transmission Electron Microscope (TEM).

If the first composite 20' and a second composite 30', which will be described further below, are less phase-soluble, the boundary between the first resin 20 and the second resin 30 can be observed as an interface. If the first composite 20' and a second composite 30' are similar to each other in composition and the interface therebetween disappear in a process described further below, the boundary may be observed as a boundary layer with the first resin 20 and the second resin 30 mixed together.

The first electronic component 101 may be, for example, a flat display such as a liquid-crystal display, an organic EL display, or a plasma display, and the first member 102 is preferably an insulating substrate such as, for example, a glass substrate or a transparent film substrate. The first electrode 110 corresponds to, for example, an external connection terminal provided to a display. The first electrode 110 and the terminal 104 may be formed of a transparent conductive material such as ITO (indium tin oxide) or IZO (indium zinc oxide); a metal such as copper (Cu), aluminum (Al), molybdenum (Mo), or titanium (Ti); an alloy including at least one type thereof (such as Mo—Ti alloy); or a laminated structure of these materials (such as Mo/Cu laminated structure, Mo—Ti alloy/Cu laminated structure, Mo/Al laminated structure, Mo/Al/Mo laminated structure, or Al/Ti laminated structure).

The second electronic component 111 may be a Si chip having an integrated circuit formed thereon. In this case, the second electrode 114 corresponds to an external connection terminal (bonding pad) provided to the integrated circuit. The second member 112 is preferably a silicon substrate, a SiC substrate, a sapphire substrate, a plastic substrate, or the like. The second electrode 114 is preferably formed, for example, of gold (Au) or by plating a surface of copper (Cu) with gold. When the second electronic component 111 is, for example, a flexible printed board, the second member 112 is preferably, for example, an insulating polymer film made of a polyimide, a para-based polyamide, or the like. The second electrode 114 corresponds to an external connection terminal provided to, for example, the flexible printed board, is generally formed of copper (Cu), and has its surface plated with gold.

The size of each of the first electrode 110 and the second electrode 114 when viewed in the opposing direction (D1 direction) is not limited to particular sizes. The distance between the pluralities of first electrodes 110 adjacent in the surface direction (D2-D3 surface direction) (the distance between the pluralities of second electrodes 114 adjacent in the surface direction) is not limited to particular values, and is, for example, at least equal to or large than 5 µm. This configuration allows the first electrode 110 and the second electrode 114 to be electrically connected without impairing insulation properties. In the present embodiment, the first electrode 110 and the second electrode 114 are arranged so that short sides thereof are aligned in a line at one end part of each of the first electronic component 101 and the second electronic component 111. However, this is not meant to be restrictive, and a plurality of rows of the first electrodes 110 and the second electrodes 114 may be arranged, and the first electrodes 110 and the second electrodes 114 may be arranged in a staggered formation.

The conductive particle 10 included in the connection structure 100 may be in an oblate spheroidal shape. The diameter (longitudinal diameter) of the conductive particle 10 when viewed in the opposing direction (D1 direction) of the electrodes is in a range between a value equal to or larger than 2 µm and a value equal to or smaller than 10 µm. The conductive particle 10 may originally have a spherical shape with the above-described longitudinal diameter as a diameter, and may be deformed to be flat in the opposing direction (D1 direction) of the electrodes by a range between a value equal to or larger than 10% and a value equal to or smaller than 40% with respect to 100% of the longitudinal diameter.

Figure 1D:
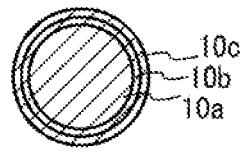
Figure 1E:
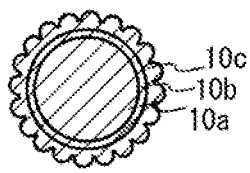

The diameter (longitudinal diameter) and the pressure deformation amount of the conductive particle 10 can be selected as appropriate from the values in the above-described range, depending on the type of the first electronic component 101 and the second electronic component 111, the method for manufacturing each connection structure, and so forth. While the conductive particle 10 has a round shape in the present embodiment as shown in FIG. 1D, this is not meant to be restrictive and, for example, as shown in FIG. 1E, the conductive particle 10 may have a spherical shape with a plurality of protrusions on its surface (a confeito shape). This is more preferable because, with the surface of the spherical shape having a fine convex configuration, the natural oxide film in the connection region can be broken, for example.

The material of the conductive particle 10 is not limited to particular materials, and any can be selected as appropriate for use from known conductive particles. The conductive particle 10 may be a metal-coated particle by coating with metals 10b and 10c such as nickel (Ni), copper (Cu) or gold (Au), a particle core with a highly-hard resin material coated with a rubber-like elastic resin or a particle core 10a with a highly-hard inorganic material coated with a rubber-like inorganic elastic body, as shown in FIG. 1D and FIG. 1E. In metal coating, a Ni/Cu laminated structure, a Ni/Au laminated structure, or a Cu/Au laminated structure may be formed by, for example, barrel sputtering, metal nanoparticle plating, electroless plating, ultrasonic plating, or the like.

The first resin 20 and the second resin 30 are formed by curing the first composite 20' and the second composite 30' including different materials. The materials of the first composite 20' and the second composite 30' are not limited to particular materials, and any can be selected as appropriate from known curable resin materials. In the present embodiment, the curable resin materials of the first composite 20' and the second composite 30' both contain a radical-polymerization resin. As the radical-polymerization resin, a (meth)acrylic monomer or (meth)acrylate oligomer is preferable, and one bonded in an ester form is more preferable. The (meth)acrylate oligomer has at least one (meth)acryloyl group or more and, for example, epoxy acrylate, urethane acrylate, polyester acrylate, polybutadiene acrylate, polyol acrylate, polyether acrylate, silicone resin acrylate, melamine acrylate, or the like can be used. The (meth)acryl oligomer may be monofunctional or polyfunctional, and preferably contains a polyfunctional monomer or oligomer. The curably resin material may be configured by selecting two or more types from (meth)acrylate monomers and (meth)acrylate oligomers.

In particular, as a curable resin material of the second composite 30', one with a low volume shrinkage ratio at the time of curing is preferable. Thus, the (meth)acrylic monomer may contain, for example, an amide methylol structure portion, and may contain a dendrimer or hyper branch polymer structure portion. In a (meth)acrylic monomer compound having an amide methylol structure portion, together with polymerization of carbon-carbon double bonds derived from (meth)acrylic acid, methylene-oxygen bonds in the amide methylol structure portion are cleaved at the time of photocuring. Thus, with the second compound 30' containing a (meth)acrylic monomer compound having at least one amide methylol structure portion formed of —CO—NH—CH$_2$—O— in a molecule as a curable component, the volume shrinkage ratio of the second resin 30 due to curing of the second composite 30' can be more reduced, and warpage due to a difference in flexural rigidity between the first electronic component 101 and the second electronic component 111 can be reduced. With a branch including a dendrimer or hyperbranch polymer structure portion having an acryl group, a Van der Waals distance between branches becomes shorter than a Van der Waals distance between general molecules. Thus, with the second composite 30' containing a dendrimer or hyperbranch polymer structure portion having an acryl group as a curable component, the volume shrinkage ratio of the second resin 30 due to curing of the second composite 30' can be more reduced, and warpage due to a difference in flexural rigidity between the first electronic component 101 and the second electronic component 111 can be reduced.

As the curable resin material of the second composite 30', a fluorene-based acrylate is preferably used. The second composite 30' may contain an ene/thiol-based curable resin containing a composite having an ethylene unsaturated double bond and a thiol compound as a curable component, at least one of these components may contain a compound having a 9,9-bisarylfluorene skeleton. The 9,9-bisarylfluorene compound may be a 9,9-bisaryifluorene compound having an ethylene unsaturated bond and/or a 9,9-bisarylfluoren compound having a mercapto group. As the ethylene unsaturated compound, for example, 9,9-bis(4-acryloyloxyethoxyphenyl)fluorene (produced by Osaka Gas Chemicals Co., Ltd., OGSOL EA-0200) and phenoxyethyl acrylate (produced by KYOEISHA CHEMICAL CO., LTD., LIGHT ACRYLATE POA) may be used. As the thiol compound, for example, pentaerythritol tetra (3-mercaptobutyrate) (produced by SHOWA DENKO K. K., Karenz MT PE1) may be used. With the second composite 30' containing this curable resin material, the volume shrinkage ratio of the second resin 30 due to curing of the second composite 30' can be more reduced, and warpage due to a difference in flexural rigidity between the first electronic component 101 and the second electronic component 111 can be reduced.

As the curable resin material of the second composite 30', an ene compound having in a molecule two or more functional groups selected from a group of an allyl ether group, a vinyl ether group, an acrylate group, and a methacrylate group or ene compound as a mixture of two or more types of the above-described ene compounds, and a substance obtained by performing oxidizing-compound-process on the ene/thiol-based curable resin containing a thiol compound having two or more thiol groups in one molecule may be used. A compound having two or more mercapto groups in one molecule may contain esters obtained from mercaptocarboxylic acid and polyhydric alcohol, aliphatic polythiols, aromatic polythiols, and other polythiols, or one, two or more of these may be used. The oxidizing-compound process is preferably performed with a gas having oxidative capacity. The gas having oxidative capacity is a compound having air properties and oxidative capacity under temperature and atmospheric pressure conditions for performing oxidizing-compound process. As the gas having oxidative capacity, air, oxygen, ozone, or the like can be used, and a mixture gas partially containing any of these may be used. The second composite 30' can enhance stability with time by performing oxidizing-compound process on the above-described photocurable resin material.

The materials of the first composite 20' and the second composite 30' further contain a photocuring initiating component. The photocuring initiating component is a photoradical initiator, and may be any compound which generates radicals by irradiating ultraviolet rays or visible rays. As an ultraviolet-ray radical initiator, for example, an acetophenone-based initiator, a benzoin-ether-based initiator, a benzophenone-based initiator, an α-diketone-based initiator, a thioxanthone-based initiator, or the like can be used. As a visible-ray radical initiator, for example, a camphorquinone-based compound, an acylphosphine oxide compound, or the like can be used. Also, one classified as an ultraviolet-ray radical initiator but capable of visible-ray radical initiation by using combination with a sensitizer may be used. The sensitizer can be appropriately used as required. As the sensitizer, a known composite can be used. For example, an amine-based compound, a (meth)acrylic acid ester of an alkanol amine, or the like can be used. A plurality of types of the photocuring initiating component and the sensitizer can be used in combination. For example, by using an ultraviolet-ray radical initiator and a visible-ray radical initiator in combination, a curable wavelength region can be expanded. The photocuring initiating component is more preferably a photoradical initiator which generates radicals with a irradiation light in a range of wavelength between a value equal to or larger than 300 nm and a value equal to or smaller than 500 nm. The photocuring initiating component is compounded in the curable resin material so that the curable resin material can be curing at room temperatures with a light irradiation for a period of preferably equal to or shorter than approximately three seconds, more preferably equal to or shorter than one second. The curable resin material is selected as appropriate so as to allow curing at room temperatures with the above-described time period.

In the present embodiment, the first composite 20' and the second composite 30' more preferably further contain a shielding part curable activation compound such as, for example, a chain transfer agent. The chain transfer agent transmits radicals generated by light irradiation to a shielding part which light does not directly reach. As the chain transfer agent, for example, a compound containing at least one or more of selected from a urethane bond, a urea bond, and an isocyanate group and one or more of alkoxysilyl group can be used. In photocuring reaction using the above-described chain transfer agent, polyalcohol having a hydroxyl group as one type of anion is generated as a by-product. With this polyalcohol and the alkoxysilyl group containing in the chain transfer agent undergoing a transesterification, curing further proceeds. That is, with the chain transfer agent being contained in the first composite 20' and the second composite 30', radical curing and anion curing occur simultaneously, thereby allowing curing of the shielding part where light does not directly reach.

With the first composite 20' and the second composite 30' containing a shielding part curable activation compound, the first composite 20' and the second composite 30' can be reliably cured even under conditions with the connection method, the material of the first electronic component 101, the second electronic component 111, the first electrode 110, and the second electrode 114, and so forth in which the first composite 20' and the second composite 30' cannot be cured only with the action of a photocuring initiating component by light irradiation.

In the present embodiment, the material of the first composite 20' may further contain an anaerobic curing initiating component. As the anaerobic curing initiating component, a known group including organic peroxide and a curing accelerator can be used. As the organic peroxide, for example, any of hydroperoxides, ketone peroxides, diallyl peroxides, peroxyesters, and so forth can be used. As the curing accelerator, for example, an o-benzoic sulfimide (saccharin), a hydrazine compound, an amine compound, a mercaptan compound, or the like can be used. A plurality of types of the anaerobic curing initiation component and the curing accelerator may be used in combination.

In the present embodiment, the first composite 20' is surrounded by the first surface (including the first electrode 110), the second surface (including the second electrode 114), and the second composite 30'. Furthermore, the first composite 20' is in contact with the first electrode 110, the second electrode 114, and the conductive particles 10. The first electrode 110, the second electrode 114, and the conductive particles 10 contain transition metals. Thus, with the first composite 20' containing an anaerobic curing initiating component, a redox reaction by the cure acceleration agent and the transition metal ions dissolves peroxide, thereby allowing anaerobic curing of the first composite 20' to be initiated.

With the first composite 20' further containing an anaerobic curing initiating component, the first composite 20' can be reliably cured even under conditions with the connection method, the material of the first electronic component 101, the second electronic component 111, the first electrode 110, and the second electrode 114, and so forth in which the first composite 20' cannot be cured only with the action of a photocuring initiating component by light irradiation.

The additive can be appropriately used as required to improve or modify the properties such as fluidity, coating characteristics, preservability, curing characteristics, and physical properties after curing. As the additive, any known compound can be used. Examples of the additive include a silane coupler, a diluent, a modifying agent, a surface active agent, a preservative stabilizer, an antiforming agent, and a leveling agent, although not limited thereto. The silane coupler is not limited to particular agent and for example, any of epoxy-based, amino-based, mercapto/sulfide-based, and ureido-based ones and so forth can be used. With the addition of silane coupler, adhesion at the interface between the organic material and the inorganic material is improved.

The viscosity of the first composite 20' is higher than the viscosity of the second composite 30'. The viscosity of the first composite 20' is in a range between a value equal to or higher than $5 \times 10^3$ cP and a value equal to or lower than $5 \times 10^5$ cP. The viscosity of the second composite 30' is in a range between a value equal to or higher than $2 \times 10^3$ cP and a value equal to or lower than $2 \times 10^5$ cP. It is required that the viscosity of the first composite 20' is twice as high as the viscosity of the second composite 30' or higher. The viscosity of the first composite 20' and the second composite 30' can be controlled also by the degree of polymerization of the resin material contained in the first composite 20' and the second composite 30'. The viscosity of each composite can be selected as appropriate from values within the above-described range, depending on the type of the first electronic component 101 and the second electronic component 111, the method for manufacturing connection structure, the method for composite arrangement, and so forth. If the viscosity of the first composite 20' is lower than $5 \times 10^3$ cP, uniform dispersibility of the conductive particles 10 in the first composite 20' is degraded, and sedimentation and agglomeration tend to occur. With the viscosity of the first composite 20' being higher than the viscosity of the second composite 30', the conductive particles 10 mixed into the first composite 20' is inhibited from flowing, and can be efficiently arranged between the first electrode 110 and the second electrode 114. Therefore, connection reliability between the first electrode 110 and the second electrode 114 can be ensured.

The first resin 20 and the second resin 30 are formed by curing the first composite 20' and the second composite 30'. The volume shrinkage ratio of the first resin 20 due to curing of the first composite 20' and the volume shrinkage ratio of the second resin 30 due to curing of the second composite 30' are both preferably equal to or smaller than 4%, and more preferably equal to or smaller than 2%. If the volume shrinkages ratio of the first resin 20 and the second resin 30 are larger than 4%, an inner shrinkage stress occurs, warpage due to a difference in flexural rigidity between the first electronic component 101 and the second electronic component 111 tends to occur, and physical connection reliability between the first electronic component 101 and the second electronic component 111 is degraded.

The first resin 20 more preferably has high power of adhesion to a conductive material such as a metal material or metal oxide material. The first resin 20 preferably has high power of adhesion to a metal material forming the first electrode 110 and the second electrode 114, and preferably has high power of adhesion to, for example, Au, ITO, and so forth. The second resin 30 preferably has high power of adhesion to a resin material. The second resin 30 preferably has high power of adhesion to an insulating film material forming the first surface of the first member 102 and the second surface of the second member 112, and preferably has high power of adhesion to an insulating material such as, for example, polyimide, para-based polyamide film, P-SiNx, glass, and so forth. The adhesion power of the first resin 20 is preferably in a range equal to or larger than 500 N/m. The adhesion power of the second resin 30 is preferably in a range equal to or larger than 700 N/m. The adhesion power, glass transition temperature, and hardness of each resin can be selected as appropriate, depending on the type of the first electronic component 101 and the second electronic component 111, the method for manufacturing connection structure, and so forth. With the first resin 20 and the second resin 30 each being selected depending on the material of an adherend, the adhesive power between the first surface of the first member 102 and the second surface of the second member 112 can be further improved. Therefore, physical connection reliability between the first electronic component 101 and the second electronic component 111 can be improved.

The Method for Manufacturing Connection Structure

Next, a method for manufacturing connection structure according to one embodiment of the present invention is described by using FIG. 2A to FIG. 5E.

Since the existing first electronic component 101 and second electronic component 111 can be used in the present embodiment, their description is omitted. In FIG. 2A to FIG. 5E, the method of forming the connection structure 100 is described in detail.

First, the plurality of conductive particles 10 and the first composite 20' are arranged in a predetermined region on the first electrode 110. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable.

By using FIG. 2A to FIG. 5E, a method of arranging the plurality of conductive particles 10 and the first composite 20' is described.

Figure 2A:
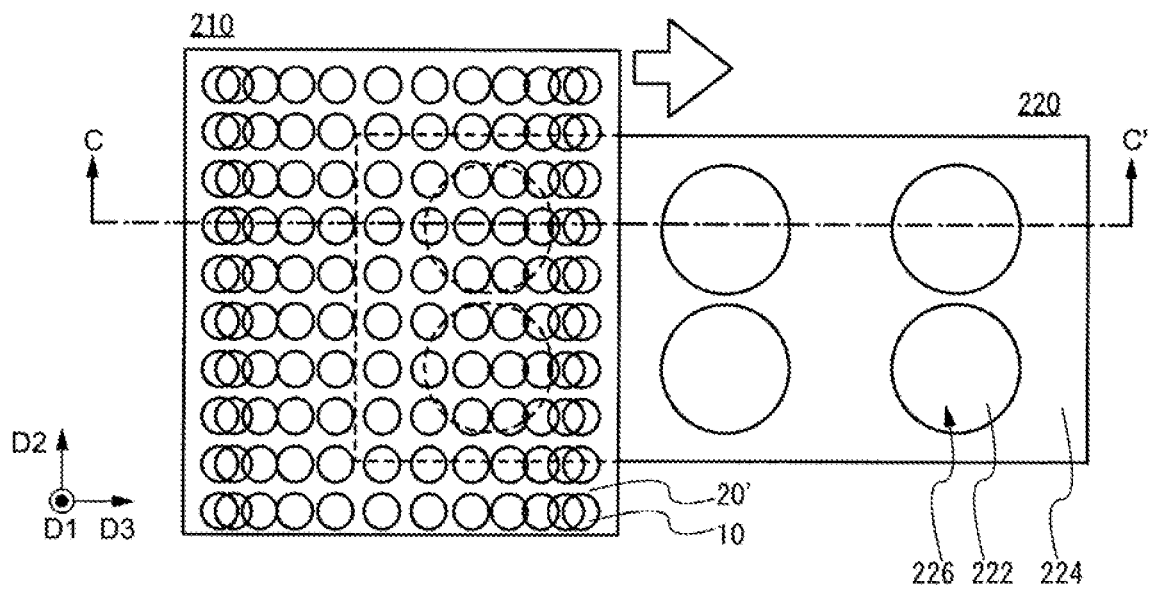
FIG. 2A to FIG. 2C shows a method for producing the connection structure according to an embodiment of the present invention.
Figure 2B:
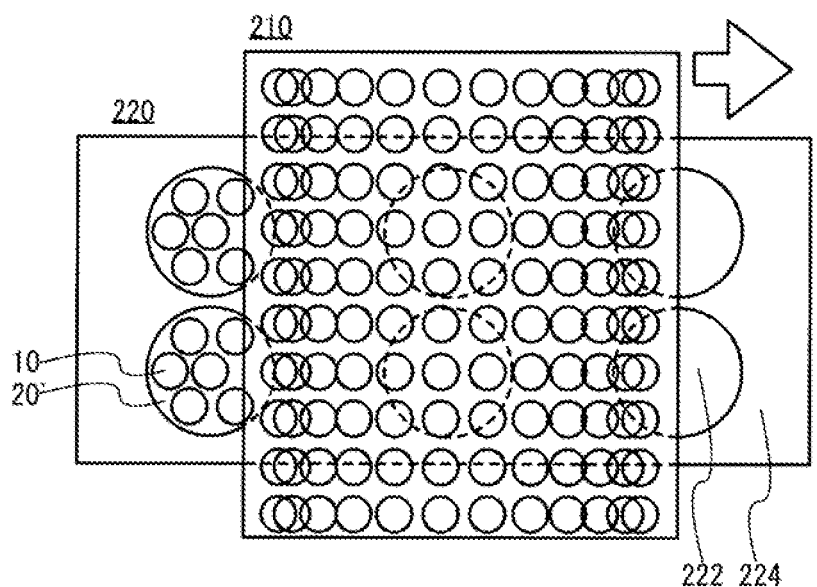
Figure 2C:
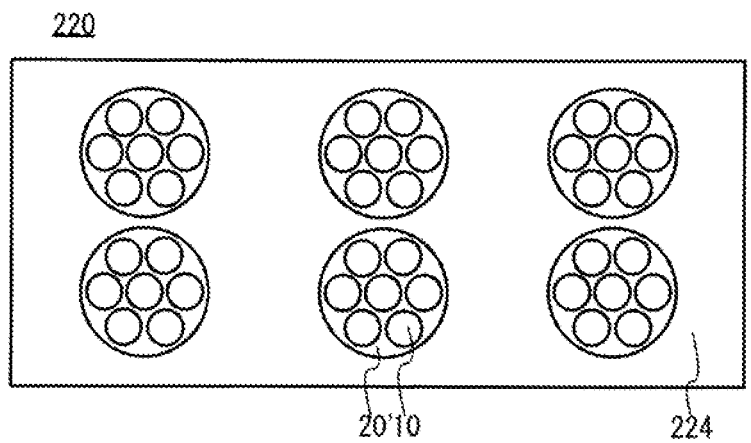
Figure 3A:
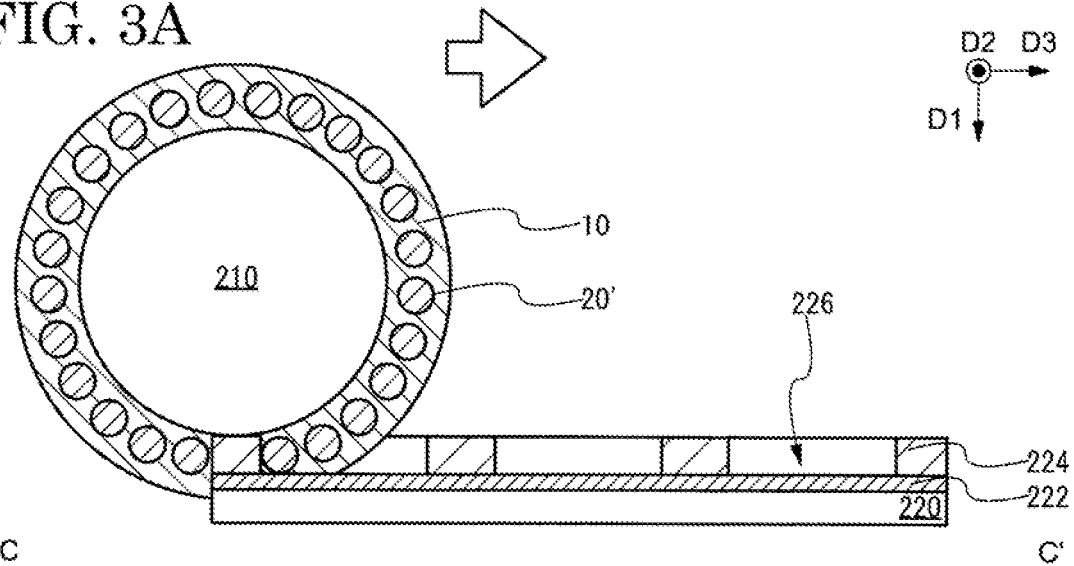
FIG. 3A to FIG. 3C shows a method for producing the connection structure according to an embodiment of the present invention.
Figure 3B:
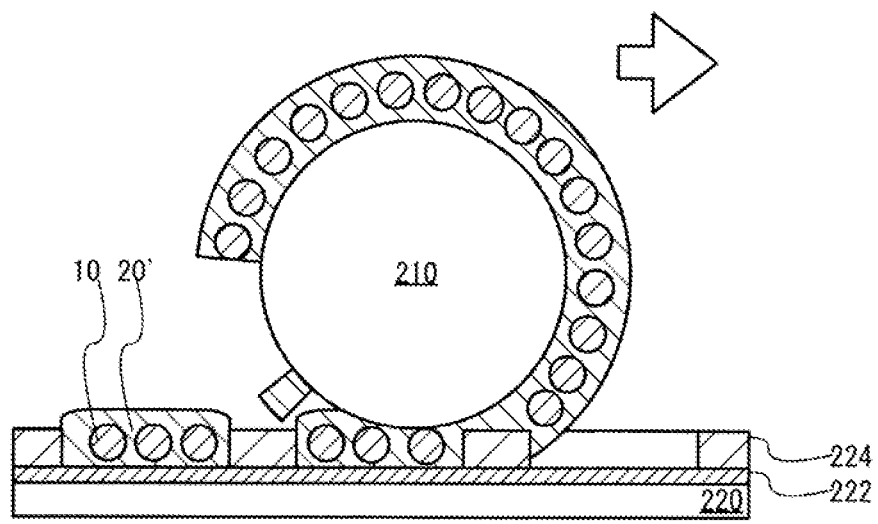
Figure 3C:
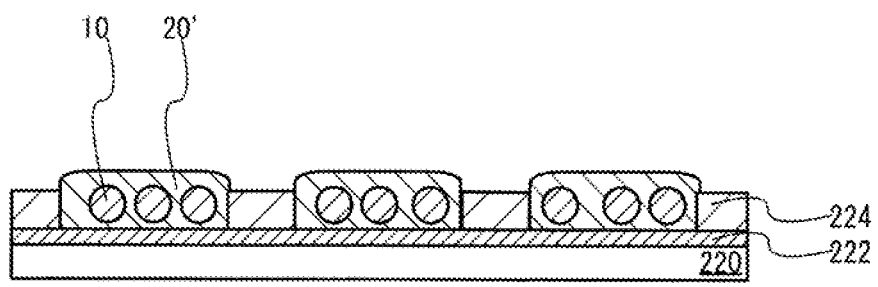

FIG. 2A to FIG. 2C show a process of arranging the plurality of conductive particles 10 and the first composite 20' on a plate 220. FIG. 3A to FIG. 3C are sectional views along a C-C' line of FIG. 2A to FIG. 2C. In the present embodiment, the plate 220 is planographic intaglio plate, for example, a waterless planographic plate. The plate 220 has depressed parts 226 corresponding to regions where the plurality of conductive particles 10 and the first composite 20' are arranged on the first surface of the first member 102. The plate 220 includes a lyophilic layer 222 and a liquid-repellent layer 224. The liquid-repellent layer 224 is arranged as a liquid contact surface, and has an opening. The liquid-repellent layer 224 exposes the lyophilic layer 222 at a bottom surface of the opening. That is, the liquid-repellent layer 224 having the opening is arranged on an upper surface of the plate 220, and the lyophilic layer 222 is arranged under the liquid-repellent layer 224. The depressed parts 226 are formed by the opening of the liquid-repellent layer 224 and the lyophilic layer 222 at the bottom surface of the opening.

The material of the lyophilic layer 222 may be, for example, an aluminum oxide ($Al_2O_3$). The material of the liquid-repellent layer 224 is preferably, for example, an elastic silicone resin. The depressed parts 226 have a depth substantially equal to the depth of the liquid-repellent layer 224. The depth of the depressed parts 226 is required to be larger than the diameter of the conductive particles 10. The plate 220 may be, in addition to a waterless planographic plate, a glass deep-etch plate, a stainless deep-etch plate, a sapphire deep-etch plate, or a zirconia deep-etch plate. The depressed parts 226 when viewed from the upper surface of the plate 220 are preferably separated from each other by 5 μm or more. If the depressed parts 226 are separated from each other by less than 5 μm, the liquid-repellent layer 224 which separates the adjacent depressed parts 226 tends to be broken, and durability of the plate 220 may be degraded.

In the present embodiment, the shape of each depressed part 226 when viewed in the opposing direction (D1 direction) of the electrodes is circle. Also, the depressed part 226 has the same shape in a depth direction. That is, the depressed part 226 has a shape obtained by cutting out a cylinder from the plate 220. However, the shape of the depressed part 226 is not limited to this, and the depressed part 226 can take any shape with the depth in the above-described range.

In the present embodiment, the mixture of the conductive particles 10 and the first composite 20' is arranged on the plate 220 by using a roller 210. As shown in FIG. 2A to FIG. 2C and FIG. 3A to FIG. 3C, the roller 210 moves as rotating from one end to the other end of the plate 220 so that an outer peripheral surface of the roller 210 is in contact with the upper surface of the plate 220 (upper surface of the liquid-repellent layer 224), thereby arranging the conductive particles 10 and the first composite 20' in the depressed parts 226.

As for the concentration of the conductive particles 10 mixed into the first composite 20', the ratio of the conductive particles 10 to the total volume of the conductive particles 10 and the first composite 20' is preferably in a range between a value equal to or larger than 20 volume % and a value equal to or smaller than 60 volume %. If the mixing amount of the conductive particles 10 is smaller than 20 volume %, it is difficult to fill the sufficient number of conductive particles 10 in the depressed parts 226. If the mixing amount of the conductive particles 10 is larger than 60 volume %, operability is degraded, and it is difficult to fill the mixture of the conductive particles 10 and the first composite 20' in the depressed parts 226. By arranging the mixture of the conductive particles 10 and the first composite 20' with the roller 210, the conductive particles 10 and the first composite 20' can be filled in the depressed parts 226 of the plate 220. Since the depressed parts 226 have the depth in the above-described range, one conductive particle 10 can be retained in the depth direction (D1 direction) of the depressed parts 226. The number of conductive particles 10 arranged in one depressed part 226 is preferably equal to or more than one and equal to or smaller than seven. The number of conductive particles 10 arranged in one depressed part 226 is preferably seven and, more preferably three. This arrangement allows the conductive particles 10 and the first composite 20' to be efficiently displaced to the pad in a process of displacing the mixture of the conductive particles 10 and the first composite 20' to the pad, which will be described further below.

Each depressed part 226 is formed by the opening of the elastic liquid-repellent layer 224. Thus, if the conductive particles 10 make contact with the liquid-repellent layer 224 as the roller 210 progress, the conductive particles 10 can be retained in the depressed parts 226 without damage. Since the depressed parts 226 have the lyophilic layer 222 at the bottom, it can retain the first composite 20'. On the other hand, the liquid-repellent layer 224 arranged on the upper surface of the plate 220 makes the first composite 20' liquid-repellent.

Figure 4A:
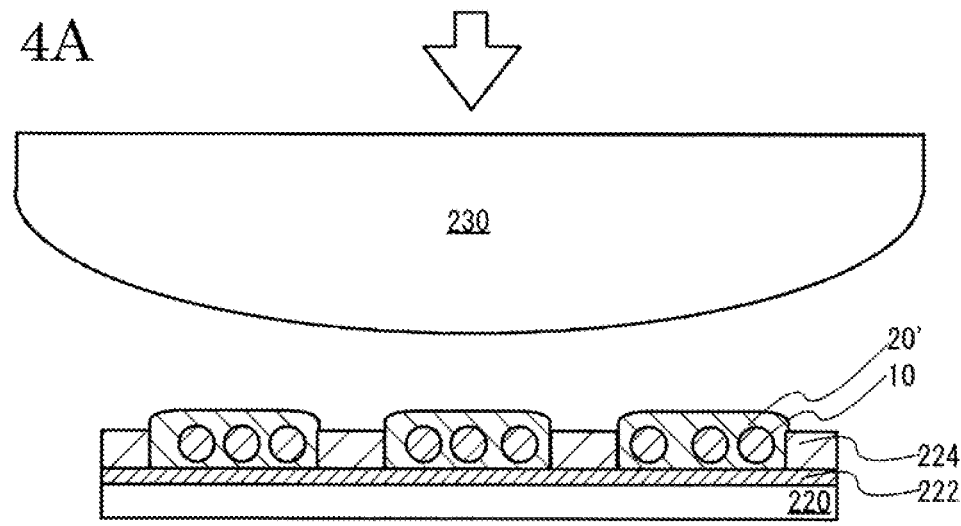
FIG. 4A to FIG. 4C shows a method for producing the connection structure according to an embodiment of the present invention.
Figure 4B:
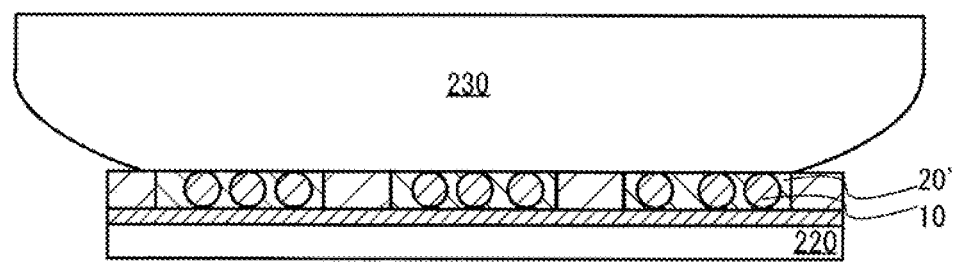
Figure 4C:
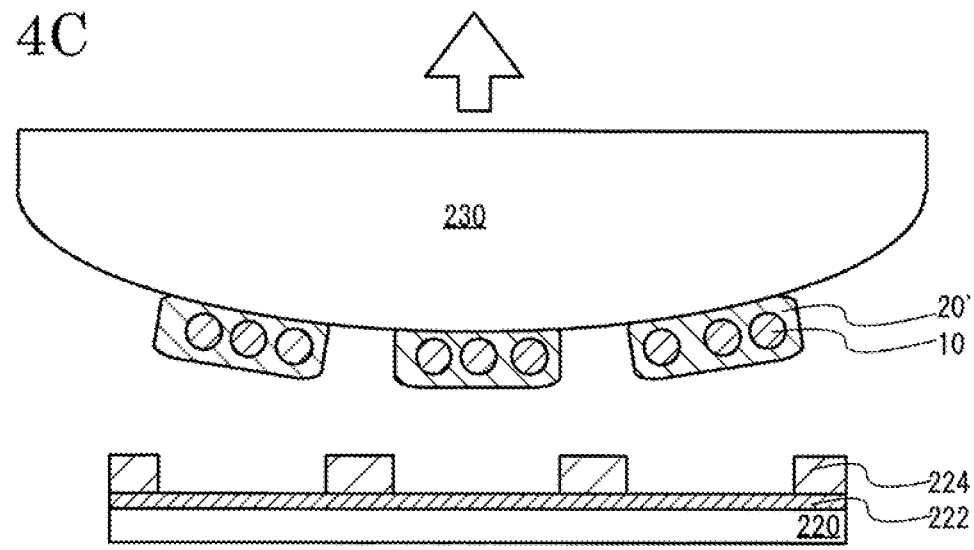

FIG. 4A to FIG. 4C show a process of displacing the mixture of the plurality of conductive particles 10 and the first composite 20' from the plate 220 to a pad 230. As shown in FIG. 4A to FIG. 4C, the pad 230 is pressed in a direction substantially perpendicular to the plate 220, and is then pulled away in the direction substantially perpendicular to the plate 220, thereby displacing the conductive particles 10 and the first composite 20' filled in the depressed parts 226 to the pad 230. Since the viscosity of the first composite 20' is in a range between a value equal to or higher than $5 \times 10^3$ cP and a value equal to or lower than $5 \times 10^5$ cP, the conductive particles 10 mixed into the first composite 20' can be retained on the surface of the pad 230.

The material of the pad 230 is preferably, for example, an elastic silicone resin or the like. The shape of the pad 230 preferably has at least a convex configuration. The shape of the pad 230 can be selected as appropriate depending on the shape of the first electronic component 101, the plate 220, and the like.

Figure 5A:
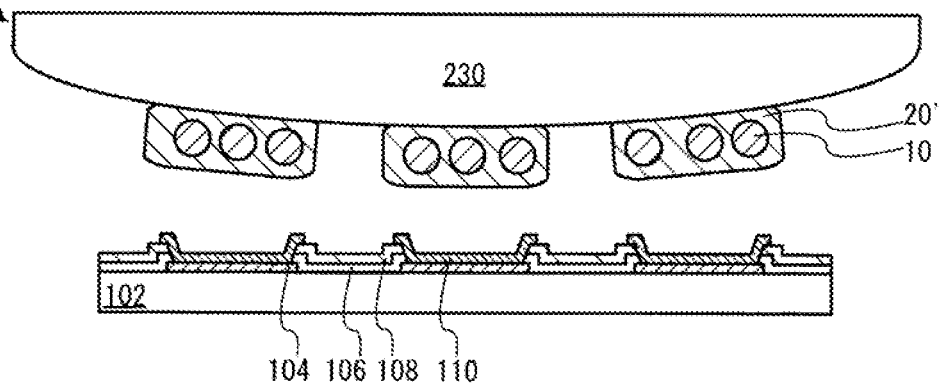
FIG. 5A to FIG. 5E shows a method for producing the connection structure according to an embodiment of the present invention.
Figure 5B:
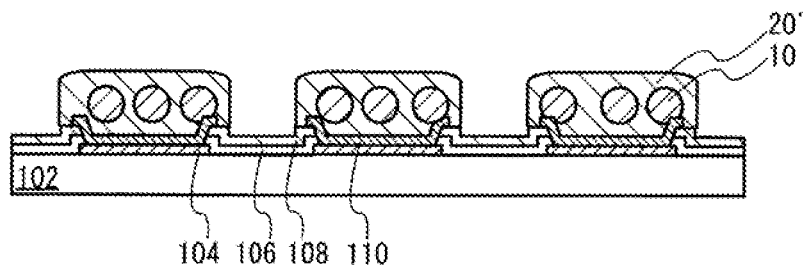

FIG. 5A and FIG. 5B shows the process of transferring the mixture of the plurality of conductive particles 10 and the first composite 20' from the pad 230 to the first electrode 110. As shown in FIG. 5A and FIG. 5B, the pad 230 is pressed in a direction substantially perpendicular to the first electrode 110, and is then pulled away in the direction substantially perpendicular to the first electrode 110, thereby transferring the mixture of the conductive particles 10 and the first composite 20' displaced to the pad 230 onto the first electrode 110. On the first surface of the first member 102, the conductive particles 10 and the first composite 20' form a convex configuration in the opposing direction (D1 direction) of the electrodes. The viscosity of the curable resin material of the first composite 20' is in the range between a value equal to or higher than $5 \times 10^3$ cP and a value equal to or lower than $5 \times 10^5$ cP. Thus, the conductive particles 10 mixed into the first composite 20' can be retained on the first electrode 110. The use of this method allows the conductive particles 10 and the first composite 20' to be reliably arranged in a predetermined region on the first electrode 110.

Figure 5C:
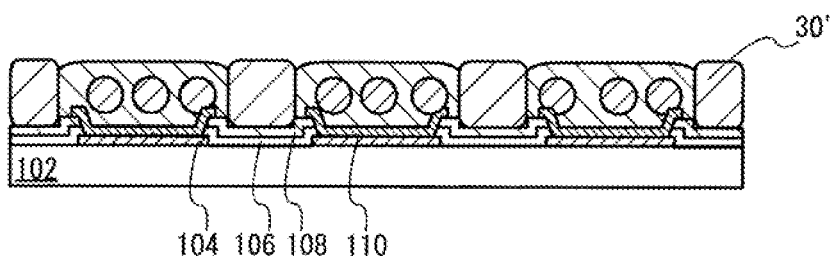

Next, the second composite 30' is arranged on the first surface of the first member 102. As shown in FIG. 5C, the second composite 30' is arranged in a region other than the first electrode 110 on the first surface of the first member 102. Furthermore, the second composite 30' is arranged also on the first electrode 110 in a region other than the region where the plurality of conductive particles 10 and the first composite 20' are arranged. That is, the second composite 30' is arranged on the first surface of the first member 102 and in the region other than the region where the plurality of conductive particles 10 and the first composite 20' are arranged. The first composite 20' and the conductive particles 10 forming a convex configuration on the first surface of the first member 102 is buried by the second composite 30'. Although not shown, in the present embodiment, as in the arrangement of the mixture of the conductive particles 10 and the first composite 20', the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, offset printing scheme, or the like can be used.

The viscosity of the second composite 30' is in a range between a value equal to or higher than $2 \times 10^3$ cP and a value equal to or lower than $2 \times 10^5$ cP. It is required that the viscosity of the first composite 20' is twice as high as high as the viscosity of the second composite 30' or higher. This allows a flow of the conductive particles 10 mixed into the first composite 20' to be inhibited, and the conductive particles 10 can be retained on the first electronic component 110.

Figure 5D:
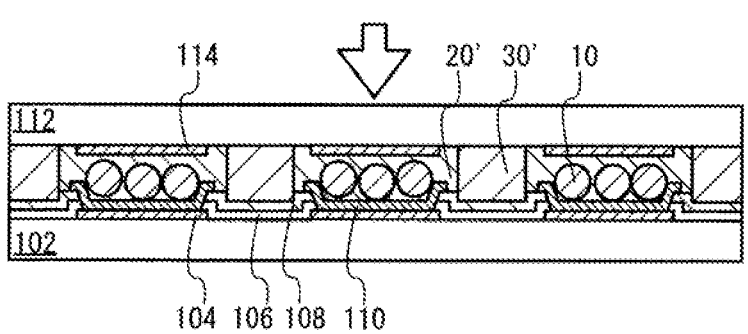

Next, the second member 112 is mounted on the first surface of the first member 102. As shown in FIG. 5D, the first surface of the first member 102 and the second surface of the second member 112 are arranged so as to be opposed to each other so that the corresponding plurality of first electrodes 110 and plurality of second electrodes 114 are opposed to each other. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the first electrode 110 has a viscosity higher than that of the second composite 30', and is thus retained on the first electrode 110 together with the conductive particles 10. The conductive particles 10 and the first composite 20' arranged on the first electrode 110 are arranged so as to be in contact with the second electrode 114, and the second composite 30' arranged in a region other than the first electrode 110 on the first surface is arranged so as to be in contact with a region other than the second electrode 114 on the second surface.

Figure 5E:
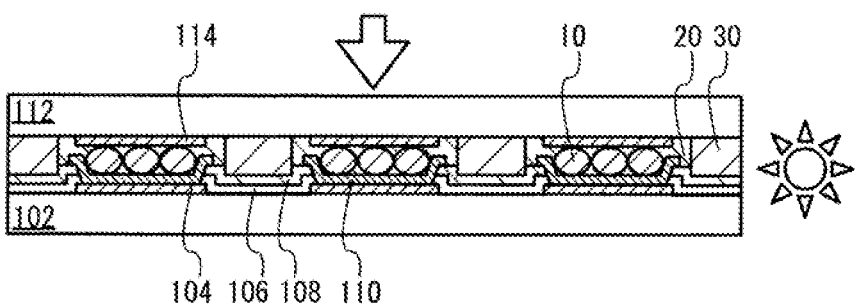

As shown in FIG. 5E, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure to push the first surface of the first member 102 and the second surface of the second member 112 can be adjusted as appropriate by a repulsive force of the conductive particles 10 and elastic forces of the first composite 20' and the second composite 30'.

Here, the conductive particles 10 are pressurized until deformed into an oblate spheroidal shape by receiving pressure from the first electrode 110 and the second electrode 114. The pressure deformation amount of the conductive particles 10 is controlled in a range between a value equal to or larger than 10% and a value equal to or smaller than 40% with respect to a longitudinal diameter of the conductive particles 10 of 100%. Here, a stress is applied among the first electrode 110, the conductive particles 10, and the second electrode 114, thereby eliminating the first composite 20' between the first electrode 110 and the conductive particles 10 and between the second electrode 114 and the conductive particles 10. Furthermore, even if a natural oxide film is formed on the first electrode 110, the conductive particles 10, or the second electrode 114 and its surface is insulated, the first electrode 110 and the second electrode 114 are press-welded with the conductive particles 10 interposed therebetween, thereby breaking the natural oxide film to form a conductive route. Deformation of the conductive particles 10 can increase the area of contact between the first electrode 110 and the conductive particles 10 and the area of contact between the second electrode 114 and the conductive particles 10. This arrangement allows the conductive particles 10 to electrically connect the first electrode 110 and the second electrode 114.

With the first member 102 and the second member 112 pressed, the connection structure 100 is irradiated with light. The wavelength region of light is preferably an ultraviolet ray and/or visible ray region. In particular, ultraviolet rays are more preferable. The wavelength region of light can be selected as appropriate depending on the photocuring initiating component and the like included in the first composite 20' and the second composite 30'. The direction of light irradiation can be selected as appropriate from a first electronic component 101 side or a second electronic component 111 side, depending on the wavelength region of light, the materials of the first member 102 and the second member 112, and so forth. Also, irradiation of light from both sides is preferable, and irradiation from a side surface without a shielding substance is also effective. The light irradiation time can be selected as appropriate depending on the photocuring initiating component, the curable resin material, and the like contained in the first composite 20' and the second composite 30'. In general, the light irradiation time is preferably equal to or shorter than approximately three seconds and, more preferable equal to or shorter than one second. In other words, light irradiation intensity, the photocuring initiating component, the curable resin material, and so forth are selected as appropriate so that curing is achieved at room temperatures within the above-described light irradiation time.

Light irradiation causes most of the first composite 20' and the second composite 30' included in the connection structure 100 to be cured at room temperatures. However, for example, a portion between the first electrode 110 and the second electrode 114 which sufficient light does not reach may be insufficiently cured. Thus, the material of the first composite 20' more preferably contains a shielding part curable activation compound, an anaerobic curing 10 initiating component, or the like. By containing a shielding part curable activation compound, an anaerobic curing initiating component, or the like, it is possible to promote curing at room temperatures even in a portion which sufficient light does not reach. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic components have high fineness and high density. Furthermore, since no heat curing connection scheme is used, the electrodes of the upper and lower substrates having different coefficients of thermal expansion can be connected with high accuracy.

Second Embodiment

The configuration of a connection structure according to a second embodiment is the same as the configuration of the connection structure according to the first embodiment. A method for manufacturing connection structure according to the present embodiment is the same as the method for manufacturing connection structure according to the first embodiment except that the process of arranging the mixture of the plurality of conductive particles 10 and the first composite 20' and the process of arranging the second composite 30' change places. The same description as that of the first embodiment is omitted, and parts different from the methods for manufacturing connection structure according to the first embodiment are described herein.

The Method for Manufacturing Connection Structure

The method for manufacturing connection structure according to one embodiment of the present invention is described by using FIG. 6A to FIG. 6F. Since the existing first electronic component 101 and second electronic component 111 can be used in the present embodiment, their description is omitted. In FIG. 6A to FIG. 6F, the method of forming the connection structure 100 is described in detail.

Figure 6A:
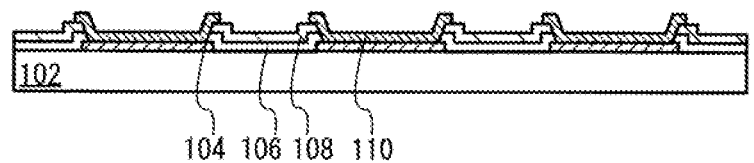
FIG. 6A to FIG. 6F shows a method for producing the connection structure according to an embodiment of the present invention.
Figure 6B:
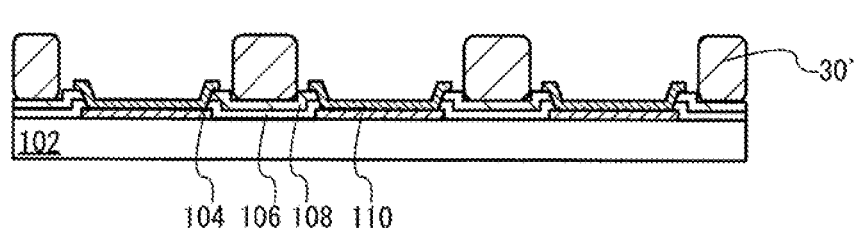

First, the second composite 30' is arranged on the first surface of the first member 102. As shown in FIG. 6A and FIG. 6B, the second composite 30' is arranged in a region other than the first electrode 110 on the first surface of the first member 102. Furthermore, the second composite 30' is arranged also on the first electrode 110 in a region other than the region where the plurality of conductive particles 10 and the first composite 20' are arranged, which will be described further below. That is, the second composite 30' is arranged on the first surface of the first member 102 and in the region other than the region where the plurality of conductive particles 10 and the first composite 20' are arranged. On the first surface of the first member 102, the second composite 30' forms a convex configuration in the opposing direction (D1 direction) of the electrodes. Although not shown, in the present embodiment, the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, offset printing scheme, or the like can be used.

The viscosity of the second composite 30' is in a range between a value equal to or higher than $2\times10^3$ cP and a value equal to or lower than $2\times10^5$ cP. This allows a flow of the second composite 30' to be inhibited.

Next, the plurality of conductive particles 10 and the first composite 20' are arranged in a predetermined region on the first electrode 110. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable. The region and method for arranging the mixture of the plurality of conductive particles 10 and the first composite 20' are the same as those of the method for manufacturing connection structure according to the first embodiment, and therefore are not described herein.

Figure 6C:
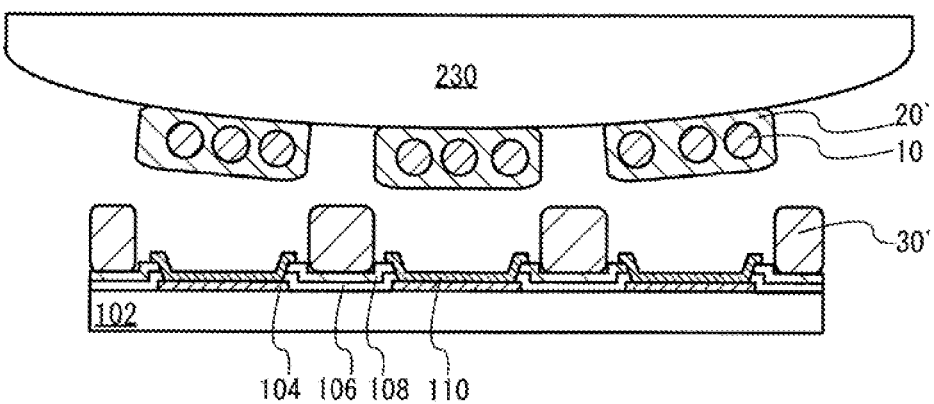
Figure 6D:
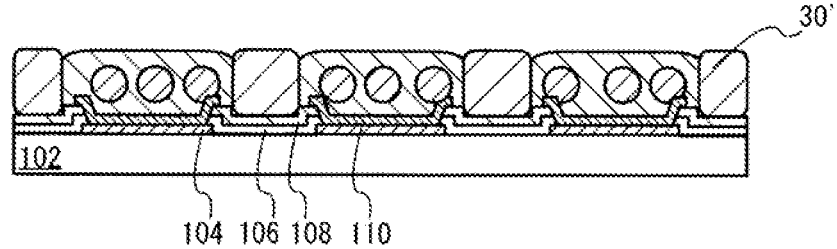

FIG. 6C and FIG. 6D shows the process of transferring the mixture of the plurality of conductive particles 10 and the first composite 20' from the pad 230 to the first electrode 110 by the pad printing scheme. As shown in FIG. 6C and FIG. 6D, the pad 230 is pushed in a direction substantially perpendicular to the first electrode 110, and is then pulled away in the direction substantially perpendicular to the first electrode 110, thereby transferring the mixture of the conductive particles 10 and the first composite 20' displaced to the pad 230 onto the first electrode 110. The second composite 30' forming a convex configuration on the first surface of the first member 102 is buried by the first composite 20' and the conductive particles 10. The viscosity of the curable resin material of the first composite 20' is in the range between a value equal to or higher than $5\times10^3$ cP and a value equal to or lower than $5\times10^5$ cP. Thus, the conductive particles 10 mixed into the first composite 20' can be retained on the first electrode 110. The use of this method allows the conductive particles 10 and the first composite 20' 15 to be reliably arranged in a predetermined region on the first electrode 110.

Figure 6E:
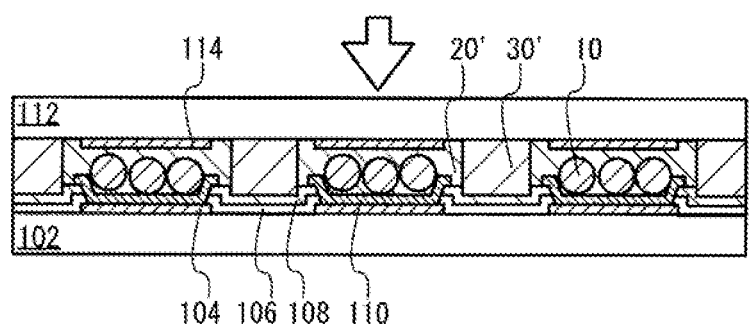

Next, the second electronic component 111 is mounted on the first surface of the first electronic component 101. As shown in FIG. 6E, the first surface of the first member 102 and the second surface of the second member 112 are arranged so as to be opposed to each other so that the corresponding plurality of first electrodes 110 and plurality of second electrodes 114 are opposed to each other. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the first electrode 110 has a viscosity higher than that of the second composite 30', and is thus retained on the first electrode 110 together with the conductive particles 10. The conductive particles 10 and the first composite 20' arranged on the first electrode 110 are arranged so as to be in contact with the second electrode 114, and the second composite 30' arranged in the region other than the first electrode 110 on the first surface is arranged so as to be in contact with a region other than the second electrode 114 on the second surface.

Figure 6F:
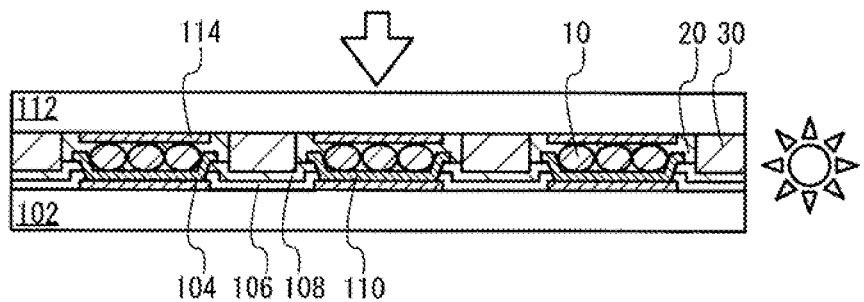

As shown in FIG. 6F, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure 15 to push the first surface of the first member 102 and the second surface of the second member 112 can be adjusted as appropriate by a repulsive force of the conductive particles 10 and elastic forces of the first composite 20' and the second composite 30'. This configuration allows electrical connection between the first electrode 110 and the second electrode 114.

With the first member 102 and the second member 112 pressed, the connection structure 100 is irradiated with light to cure the first composite 20' and the second composite 30'. A method of curing the first composite 20' and the second composite 30' is the same as that of the method for manufacturing connection structure according to the first embodiment, and is therefore not described herein. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic component have high fineness and high density. Furthermore, since no heat curing connection scheme is used, the electrodes of the upper and lower substrates having different coefficients of 10 thermal expansion can be connected with high accuracy.

Third Embodiment

The configuration of a connection structure according to a third embodiment is the same as the configuration of the connection structure according to the first embodiment. A method for manufacturing connection structure according to the present embodiment is the same as the method for manufacturing connection structure according to the first embodiment except that the second composite 30' is arranged in a region other than the second electrode 114 of the second surface. The same description as that of the first embodiment is omitted, and parts different from the methods for manufacturing connection structure according to the first embodiment are described herein.

The Method for Manufacturing Connection Structure

The method for manufacturing connection structure according to one embodiment of the present invention is described by using FIG. 7A to FIG. 7F. Since the existing first electronic component 101 and second electronic component 111 can be used in the present embodiment, their description is omitted. In FIG. 7A to FIG. 7F, the method of forming the connection structure 100 is described in detail.

First, the plurality of conductive particles 10 and the first composite 20' are arranged in a predetermined region on the first electrode 110. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable. The region and method for arranging the mixture of the plurality of conductive particles 10 and the first composite 20' are the same as those of the method for manufacturing connection structure according to the first embodiment, and therefore are not described herein.

Figure 7A:
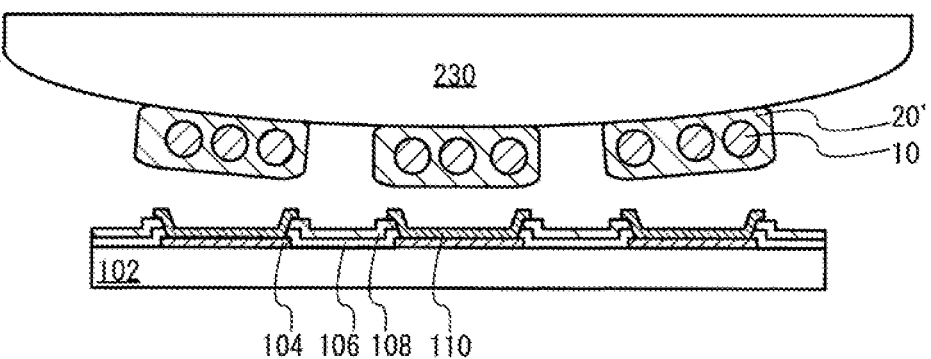
FIG. 7A to FIG. 7F shows a method for producing the connection structure according to an embodiment of the present invention.
Figure 7B:
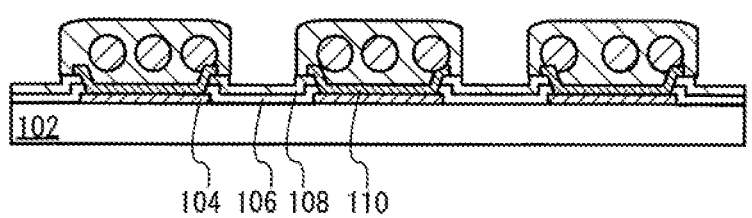

FIG. 7A and FIG. 7B shows the process of transferring the mixture of the plurality of conductive particles 10 and the first composite 20' from the pad 230 to the first electrode 110 by the pad printing scheme. As shown in FIG. 7A and FIG. 7B, the pad 230 is pushed in a direction substantially perpendicular to the first electrode 110, and is then pulled away in the direction substantially perpendicular to the first electrode 110, thereby transferring the mixture of the conductive particles 10 and the first composite 20' displaced to the pad 230 onto the first electrode 110. On the first surface of the first member 102, the conductive particles 10 and the first composite 20' form a convex configuration in the opposing direction (D1 direction) of the electrodes. The viscosity of the curable resin material of the first composite 20' is in the range between a value equal to or higher than $5 \times 10^3$ cP and a value equal to or lower than $5 \times 10^5$ cP. Thus, the conductive particles 10 mixed into the first composite 20' can be retained on the first electrode 110. The use of this method allows the conductive particles 10 and the first composite 20' to be reliably arranged in a predetermined region on the first electrode 110.

Figure 7C:
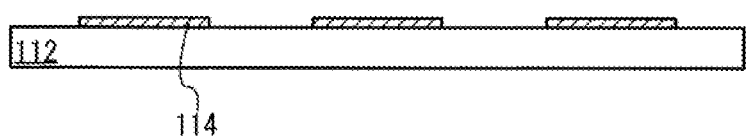
Figure 7D:
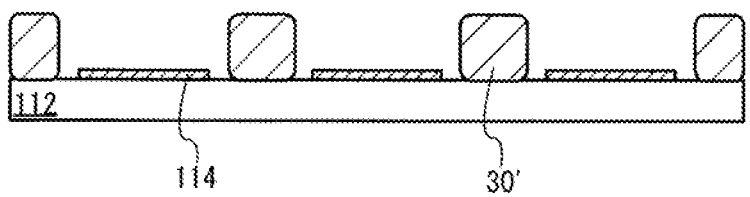

Next, the second composite 30' is arranged on the second surface of the second member 112. As shown in FIG. 7C and FIG. 7D, the second composite 30' is arranged in a region other than the second electrode 114 of the second surface of the second member 112. Furthermore, the second composite 30' is arranged also on the second electrode 114 and in a region other than the region where the plurality of conductive particles 10 and the first composite 20' are arranged, which will be described further below. That is, the second composite 30' is arranged on the second surface of the second member 112 in the region other than the region where the plurality of conductive particles 10 and the first composite 20' are arranged. On the second surface of the second member 112, 15 the second composite 30' forms a convex configuration in the opposing direction (D1 direction) of the electrodes. Although not shown, in the present embodiment, the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, offset printing scheme, or the like can be used.

The viscosity of the second composite 30' is in a range between a value equal to or higher than $2\times10^3$ cP and a value equal to or lower than $2\times10^5$ cP. This allows a flow of the second composite 30' to be inhibited.

Figure 7E:
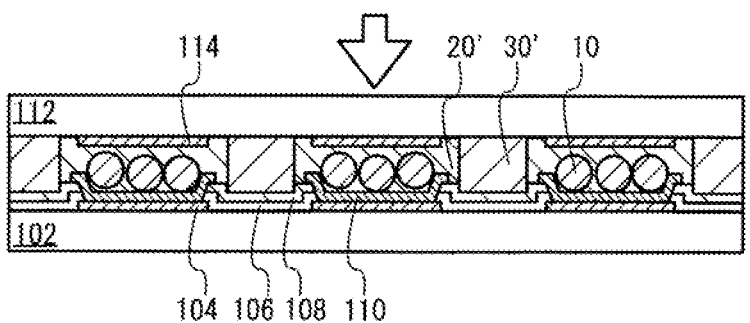

Next, the second electronic component 111 is mounted on the first surface of the first electronic component 101. As shown in FIG. 7E, the first surface of the first member 102 and the second surface of the second member 112 are arranged so as to be opposed to each other so that the corresponding plurality of first electrodes 110 and plurality of second electrodes 114 are opposed to each other. The first composite 20' and the conductive particles 10 forming a convex configuration on the first surface of the first member 102 is buried by the second composite 30' forming a convex configuration on the second surface of the second member 112. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the first electrode 110 has a viscosity higher than that of the second composite 30', and is thus retained on the first electrode 110 together with the conductive particles 10. The conductive particles 10 and the first composite 20' arranged on the first electrode 110 are arranged so as to be in contact with the second electrode 114, and the second composite 30' arranged in the region other than the second electrode 114 on the second surface is arranged so as to be in contact with a region other than the first electrode 110 on the first surface.

Figure 7F:
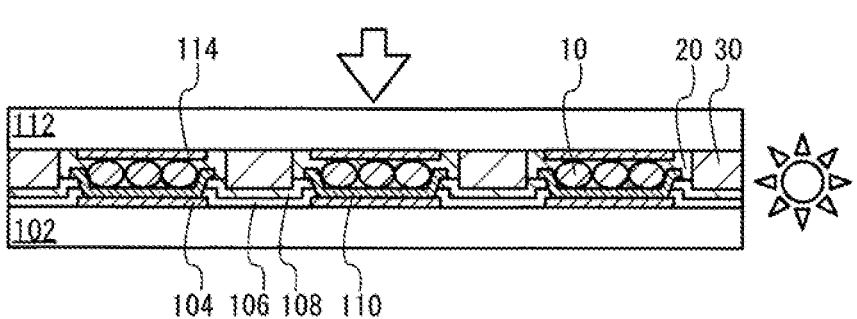

As shown in FIG. 7F, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure to push the first surface of the first member 102 and the second surface of the second member 112 can be adjusted as appropriate by a repulsive force of the conductive particles 10 and elastic forces of the first composite 20' and the second composite 30'. This configuration allows electrical connection between the first electrode 110 and the second electrode 114.

With the first member 102 and the second member 112 pressed, the connection structure 100 is irradiated with light to cure the first composite 20' and the second composite 30'. A method of curing the first composite 20' and the second composite 30' is the same as that of the method for manufacturing connection structure according to the first embodiment, and is therefore not described herein. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic component have high fineness and high density. Furthermore, since no heat curing connection scheme is used, the electrodes of the upper and lower substrates having different coefficients of thermal expansion can be connected with high accuracy.

Fourth Embodiment

The configuration of a connection structure according to a fourth embodiment is the same as the configuration of the connection structure according to the first embodiment. A method for manufacturing connection structure according to the present embodiment is the same as the method for manufacturing connection structure according to the first embodiment except that the second composite 30' is arranged in a region other than the first electrode 110 of the first member 102 and the plurality of conductive particles 10 and the first composite 20' are arranged on the second electrode 114 of the second member 112. The same description as that of the first embodiment is omitted, and parts different from the method for manufacturing connection structures according to the first embodiment are described herein.

The Method for Manufacturing Connection Structure

The method for manufacturing connection structure according to one embodiment of the present invention is described by using FIG. 8A to FIG. 8F. Since the existing first electronic component 101 and second electronic component 111 can be used in the present embodiment, their description is omitted. In FIG. 8A to FIG. 8F, the method of forming the connection structure 100 is described in detail.

Figure 8A:
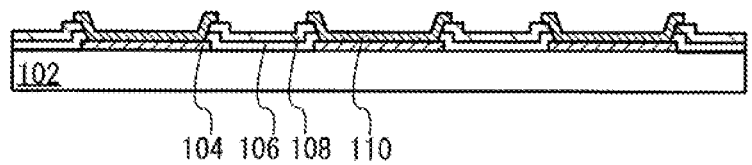
FIG. 8A to FIG. 8F shows a method for producing the connection structure according to an embodiment of the present invention.
Figure 8B:
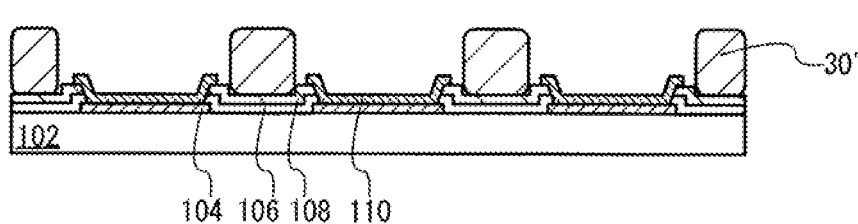

First, the second composite 30' is arranged on the first surface of the first member 102. As shown in FIG. 8A and FIG. 8B, the second composite 30' is arranged in a region other than the first electrode 110 on the first surface of the first member 102. Furthermore, the second composite 30' is arranged also on the first electrode 110 in a region other than the region where the plurality of conductive particles 10 and the first composite 20' are arranged, which will be described further below. That is, the second composite 30' is arranged on the first surface of the first member 102 and in the region other than the region where the plurality of conductive particles 10 and the first composite 20' are arranged. On the first surface of the first member 102, the second composite 30' forms a convex configuration in the opposing direction (D1 direction) of the electrodes. Although not shown, in the present embodiment, the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, offset printing scheme, or the like can be used.

The viscosity of the second composite 30' is in a range between a value equal to or higher than $2\times10^3$ cP and a value equal to or lower than $2\times10^5$ cP. This allows a flow of the second composite 30' to be inhibited.

Next, the plurality of conductive particles 10 and the first composite 20' are arranged in a predetermined region on the second electrode 114. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable. The region and method for arranging the mixture of the plurality of conductive particles 10 and the first composite 20' are the same as those of the method for manufacturing connection structure according to the first embodiment, and therefore are not described herein.

Figure 8C:
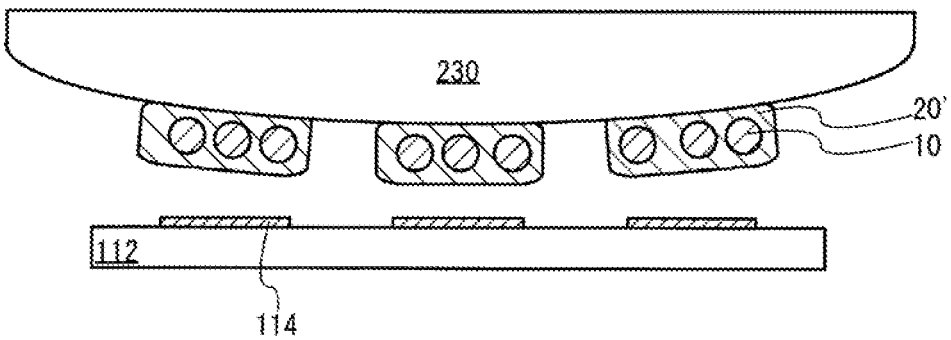
Figure 8D:
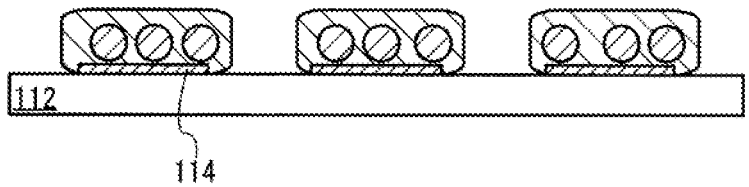

FIG. 8C and FIG. 8D shows the process of transferring the mixture of the plurality of conductive particles 10 and the first composite 20' from the pad 230 to the second electrode 114 by the pad printing scheme. As shown in FIG. 8C and FIG. 8D, the pad 230 is pushed in a direction substantially perpendicular to the second electrode 114, and is then pulled away in the direction substantially perpendicular to the second electrode 114, thereby transferring the mixture of the conductive particles 10 and the first composite 20' displaced to the pad 230 onto the second electrode 114. On the second surface of the second member 112, the conductive particles 10 and the first composite 20' form a convex configuration in the opposing direction (D1 direction) of the electrodes. The viscosity of the curable resin material of the first composite 20' is in the range between a value equal to or higher than $5 \times 10^3$ cP and a value equal to or lower than $5 \times 10^5$ cP. Thus, the conductive particles 10 mixed into the first composite 20' can be retained on the second electrode 114. The use of this method allows the conductive particles 10 and the first composite 20' to be reliably arranged in a predetermined region on the second electrode 114.

Figure 8E:
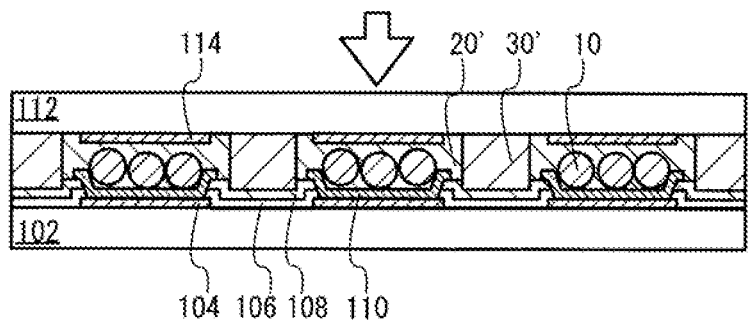

Next, the second electronic component 111 is mounted on the first surface of the first electronic component 101. As shown in FIG. 8E, the first surface of the first member 102 and the second surface of the second member 112 are arranged so as to be opposed to each other so that the corresponding plurality of first electrodes 110 and plurality of second electrodes 114 are opposed to each other. The second composite 30' forming a convex configuration on the first surface of the first member 102 is buried by the first composite 20' and the conductive particles 10 forming a convex configuration on the second surface of the second member 112. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the first electrode 110 has a viscosity higher than that of the second composite 30', and is thus retained on the first electrode 110 together with the conductive particles 10. The conductive particles 10 and the first composite 20' arranged on the second electrode 114 are arranged so as to be in contact with the first electrode 110, and the second composite 30' arranged in the region other than the first electrode 110 of the first surface is arranged so as to be in contact with a region other than the second electrode 114 on the second surface.

Figure 8F:
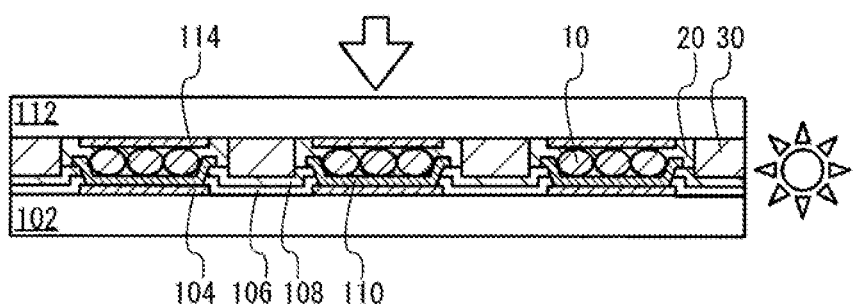

As shown in FIG. 8F, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure to push the first surface of the first member 102 and the second surface of the second member 112 can be adjusted as appropriate by a repulsive force of the conductive particles 10 and elastic forces of the first composite 20' and the second composite 30'. This configuration allows electrical connection between the first electrode 110 and the second electrode 114.

With the first member 102 and the second member 112 pressed, the connection structure 100 is irradiated with light to cure the first composite 20' and the second composite 30'. A method of curing the first composite 20' and the second composite 30' is the same as that of the method for manufacturing connection structure according to the first embodiment, and is therefore not described herein. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic component have high fineness and high density. Furthermore, since no heat curing connection scheme is used, the electrodes of the upper and lower substrates having different coefficients of thermal expansion can be connected with high accuracy.

Fifth Embodiment

The configuration of a connection structure according to a fifth embodiment is the same as the configuration of the connection structure according to the first embodiment except that insulating particles 40 are contained in the region where the second resin 30 is arranged. The same description as that of the first embodiment is omitted, and parts different from the connection structure according to the first embodiment are described herein.

Configuration of Connection Structure

Figure 9A:
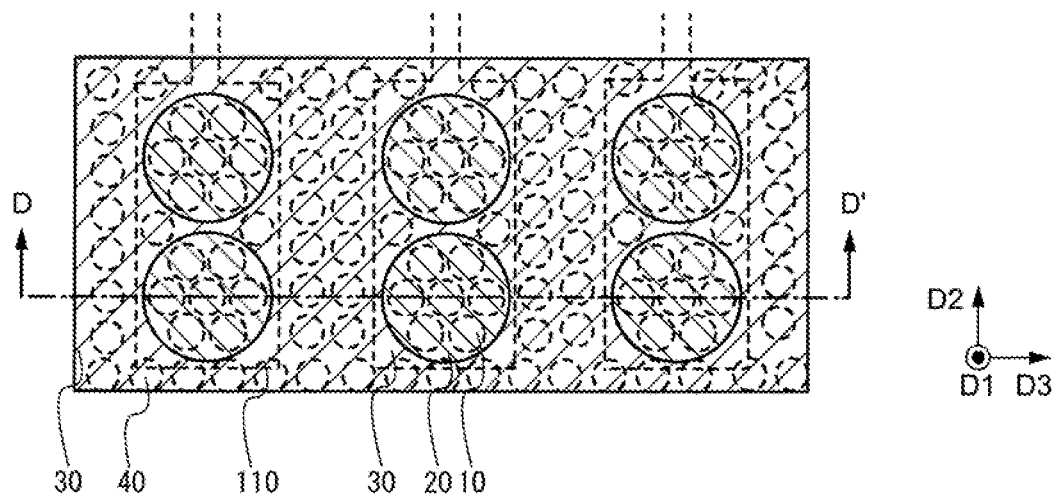
FIG. 9A to FIG. 9C shows a configuration of a connection structure according to an embodiment of the present invention.
Figure 9B:
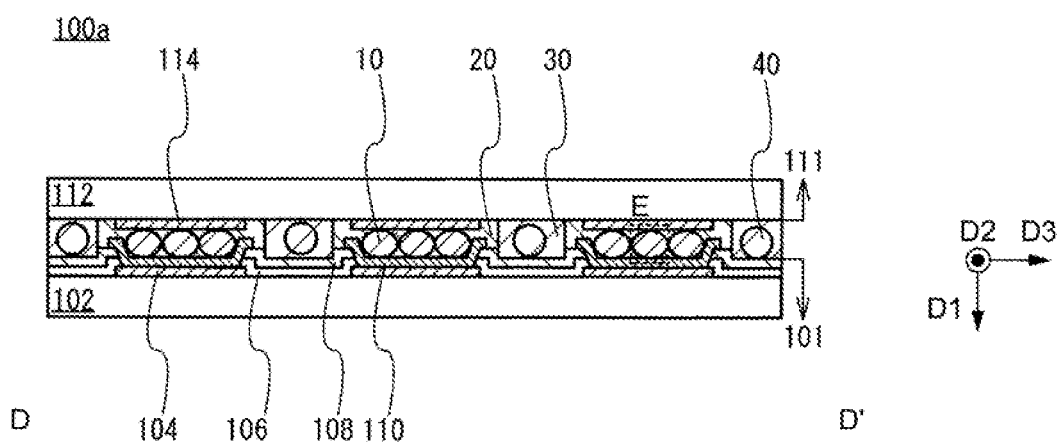
Figure 9C:
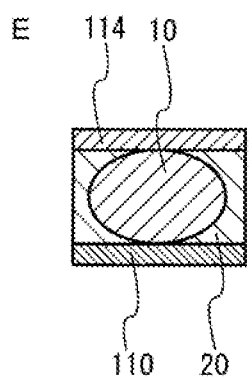

FIG. 9A to FIG. 9C shows the configuration of a connection structure according to one embodiment of the present invention. FIG. 9A is a plan view of the connection structure according to one embodiment of the present invention. FIG. 9B is a sectional view along a D-D' line of FIG. 9A. FIG. 9C is an enlarged sectional view of a conductive particle in a region E of FIG. 9B.

As shown in FIG. 9A and FIG. 9B, a connection structure 100a according to the present embodiment includes the first member 102 having the first surface, the first electrode 110, the second member 112 having the second surface, the second electrode 114, the conductive particles 10, the first resin 20, the second resin 30, and insulating particles 40.

The second resin 30 and the plurality of insulating particles 40 are arranged between the first surface of the first member 102 and the second surface of the second member 112. The second resin 30 and the plurality of insulating particles 40 are arranged in a region not between the opposing first electrode 110 and second electrode 114. The second resin 30 and the plurality of insulating particles 40 are arranged between a region other than the first electrode of the first surface and a region other than the second electrode of the second surface. That is, the second resin 30 and the plurality of insulating particles 40 are arranged between the plurality of first electrodes 110 adjacent in the surface direction (D2-D3 surface direction) and on the periphery thereof (between the plurality of second electrodes 114 adjacent in the surface direction and on the periphery thereof). Furthermore, the second resin 30 and the insulating particles 40 are also arranged between the first electrode 110 and the second electrode 114 and in a region other than the region where the conductive particles 10 and the first resin 20 are arranged. The second resin 30 and the insulating particles 40 are arranged between the regions adjacent in the surface direction (D2-D3 surface direction) where the plurality of conductive particles 10 and the first resin 20 are arranged and on the periphery thereof. The plurality of insulating particles 40 are dispersed in the second resin 30. When viewed in the opposing direction (D1 direction) of the electrodes, the plurality of respective conductive particles 10 are surrounded by the first resin 20, and the respective insulating particles 40 are surrounded by the second resin 30. Furthermore, the conductive particles 10 and the first resin 20 are surrounded by the second resin 30 and the insulating particles 40 in the surface direction (D2-D3 surface direction).

The plurality of insulating particles 40 are arranged in the surface direction (D2-D3 surface direction) between the opposing first surface and second surface in a region other than the region where the conductive particles 10 and the first resin 20 are arranged. One insulating particle 40 is arranged between the opposing first surface and second surface in the opposing direction (D1 direction) of the first surface and the second surface in a region other than the region where the conductive particles 10 and the first resin 20 are arranged. The respective insulating particles 40 may be in contact with the opposing first surface and second surface. The insulating particles 40 may be pressured and deformed in the opposing direction (D1 direction) of the electrodes between the first surface and the second surface. With a stress provided among the first surface, the insulating particles 40, and the second surface, a stress among the first electrode 110, the conductive particles 10, and the second electrode 114 can be dispersed, and reliability of the connection structure 100a is further improved.

The insulating particle 40 included in the connection structure 100a may have a spherical shape. The diameter (longitudinal diameter) of the insulating particle 40 when viewed in the opposing direction (D1 direction) of the electrodes is in a range between a value equal to or larger than 0.1 μm and a value equal to or smaller than 10 μm. The material of the insulating particle 40 is not limited to particular materials, and any can be selected as appropriate for use from among known insulating particles. The diameter (longitudinal diameter) of the insulating particle 40 can be selected as appropriate from values in the above-described range, depending on the size of the conductive particle 10, the materials and viscosities of the first composite 20' and the second composite 30', the method for manufacturing connection structure, and so forth.

While the insulating particle 40 included in the connection structure 100a has a spherical shape in FIG. 9A and FIG. 9B, the insulating particle 40 may have, for example, a fiber shape. As the material of the insulating particle 40, cellulose nanofiber can also be used. The use of these insulating particles 40 increases 10 the strength and stiffness with respect to exfoliation, and improves physical connection reliability between the first electronic component 101 and the second electronic component 111.

As for the concentration of the insulating particles 40 arranged between the opposing first surface and second surface in the region other than the region where the conductive particles 10 and the first resin 20 are arranged when viewed in the opposing direction (D1 direction) of the electrodes is preferably in a range between a value equal to or larger than 10 volume % and a value equal to or smaller than 50 volume % with respect to a total volume of the insulating particles 40 and the second composite 30'. This arrangement can prevent a short circuit between the plurality of first electrodes 110 adjacent in the surface direction (D2-D3 surface direction), between the plurality of second electrodes 114 adjacent in the surface direction (D2-D3 surface direction), and between the first electrode 110 and the second electrode 114 not opposed to each other. Also, a flow of the conductive particles 10 mixed into the first composite 20' is inhibited, and the conductive particles 10 can be efficiently arranged between the first electrode 110 and the second electrode 114. Therefore, insulation reliability and connection reliability of the connection structure 100a can be ensured.

The Method for Manufacturing Connection Structure

A method for manufacturing connection structure according to one embodiment of the present invention is the same as the method for manufacturing connection structure according to the first embodiment except that a mixture of the plurality of insulating particles 40 and the second composite 30' is arranged in place of the second composite 30'. The same description as that of the first embodiment is omitted, and parts different from the methods for manufacturing connection structure according to the first embodiment are described herein. Also, the present embodiment is not limited to this, and can be applied to the second to fourth embodiments.

The plurality of insulating particles 40 and the second composite 30' are mixed, and are arranged by using an offset printing scheme. Since the mixture of the insulating particles 40 and the second composite 30' contains the insulating particles 40, a pad printing scheme of transferring a printed matter by using a pad is particularly preferable.

As for the concentration of the insulating particles 40 mixed into the second composite 30', the insulating particles 40 is preferably in a range between a value equal to or larger than 10 volume % and a value equal to or smaller than 50 volume % with respect to a total volume of the insulating particles 40 and the second composite 30'. If the mixing amount of the insulating particles 40 is smaller than 10 volume %, it is difficult to arrange a sufficient number of insulating particles 40. If the mixing amount of the insulating particles 40 is larger than 50 volume %, operability is degraded, and it is difficult to arrange the mixture of the insulating particles 40 and the second composite 30'. A method of arranging the mixture of the plurality of insulating particles 40 and the second composite 30' is the same as the method of arranging the mixture of the plurality of conductive particles 10 and the first composite 20', and is thus omitted herein.

According to the present embodiment, a connection structure and its method for manufacturing can be provided capable of ensuring conductivity between the opposing electrodes with a simple process and reducing a short circuit between adjacent connection electrodes, even if the electrodes arranged on the electronic component have high fineness and high density.

Sixth Embodiment

The configuration of a connection structure according to a sixth embodiment is the same as the configuration of the connection structure according to the first embodiment except that the conductive nanoparticles 50 are further contained in the region where the first resin 20 is arranged. The same description as that of the first embodiment is omitted, and parts different from the connection structure according to the first embodiment are described herein.

Configuration of Connection Structure

Figure 10A:
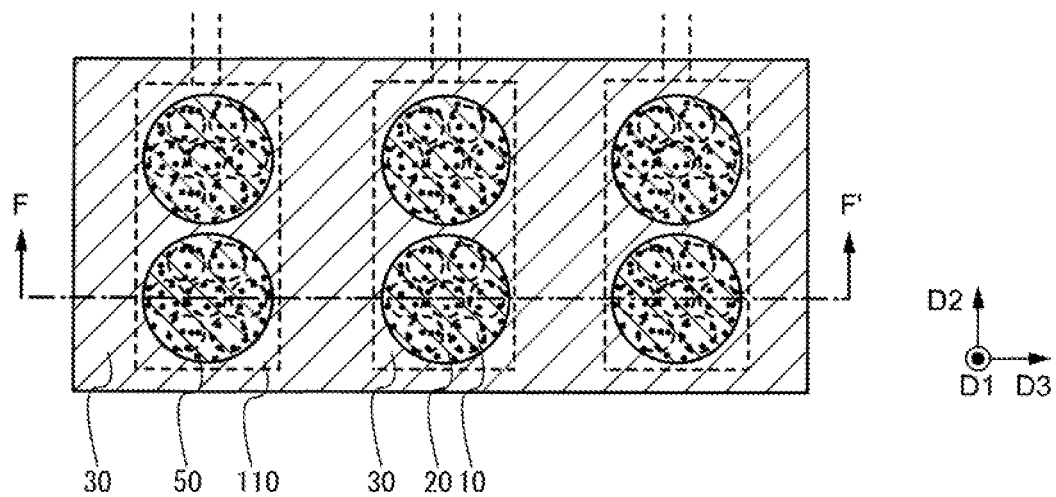
FIG. 10A to FIG. 10C shows a configuration of a connection structure according to an embodiment of the present invention.
Figure 10B:
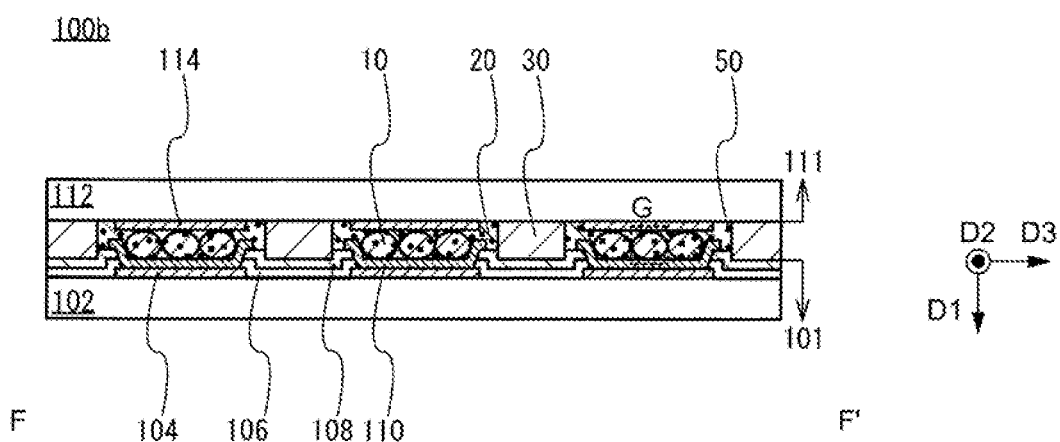
Figure 10C:
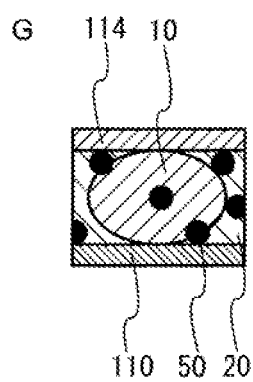

FIG. 10A to FIG. 10C shows the configuration of a connection structure according to one embodiment of the present invention. FIG. 10A is a plan view of the connection structure according to one embodiment of the present invention. FIG. 10B is a sectional view along an F-F' line of FIG. 10A. FIG. 10C is an enlarged sectional view of a conductive particle in a region G of FIG. 10B.

As shown in FIG. 10A and FIG. 10B, a connection structure 100b according to the present embodiment includes the first member 102 having the first surface, the first electrode 110, the second member 112 having the second surface, the second electrode 114, the conductive particles 10, the first resin 20, the second resin 30, and conductive nanoparticles 50.

The plurality of conductive particles 10, the plurality of conductive nanoparticles 50 and the first resin 20 are arranged between the opposing first electrode 110 and second electrode 114. The plurality of conductive particles 10 and the plurality of conductive nanoparticles 50 are arranged between the opposing first electrode 110 and second electrode 114 in the surface direction (D2-D3 surface direction). One conductive particle 10 and the plurality of conductive nanoparticles 50 are arranged between the opposing first electrode 110 and second electrode 114 in the opposing direction (D1 direction) of the electrodes. The respective conductive particles 10 may be in contact with the plurality of conductive nanoparticles 50 and the opposing first electrode 110 and second electrode 114. As shown in FIG. 10C, by the method for manufacturing connection structure, the conductive particles 10 is pressured and deformed between the first electrode 110 and the second electrode 114 in the opposing direction (D1 direction) of the electrodes. Here, the plurality of conductive nanoparticles 50 may be arranged between the conductive particles 10 and the first electrode 110 or between the conductive particles 10 and the second electrode 114. A distance between the first electrode 110 and the second electrode 114 in the opposing direction (D1 direction) of the electrodes is substantially equal to the height of the conductive particle 10 in the opposing direction (D1 direction) of the electrodes. The plurality of conductive nanoparticles 50 may be arranged at a contact part between the first electrode 110 and the conductive particle 10 and a contact part between the second electrode 114 and the conductive particle 10 when a stress is applied among the first electrode 110, the conductive particles 10, and the second electrode 114. Even if a natural oxide film is formed on the first electrode 110, the conductive particles 10, or the second electrode 114 and its surface is insulated, the conductive nanoparticles 50 are arranged when the first electrode 110 and the second electrode 114 are pressure-welded with the conductive particle 10 interposed therebetween, thereby breaking the film to form a conductive route. Furthermore, with the plurality of conductive nanoparticles 50 arranged, the area of contact region between the first electrode 110 and the conductive particle 10 and the area of contact region between the second electrode 114 and the conductive particle 10 can be increased. With the plurality of conductive nanoparticles 50 arranged in this manner, the conductive particles 10 can further reliably connect the first electrode 110 and the second electrode 114, and connection reliability of the connection structure 100b can be improved.

The plurality of conductive particles 10 and the plurality of conductive nanoparticles 50 are dispersed in the first resin 20 between the first electrode 110 and the second electrode 114. The respective conductive nanoparticles 50 and conductive particles 10 are surrounded by the first resin 20 between the first electrode 110 and the second electrode 114. The first resin 20 is an insulating resin. Thus, the connection structure 100b has insulation properties in the surface direction (D2-D3 surface direction). However, the plurality of conductive particles 10 and the plurality of conductive nanoparticles 50 arranged between the opposing first electrode 110 and second electrode 114 and adjacent in the surface direction (D2-D3 surface direction) may be in contact with each other. When the conductive particles 10 and the plurality of conductive nanoparticles 50 adjacent in the surface direction (D2-D3 surface direction) are in contact with each other, electrical connection of adjacent conductive particles 10 can be improved. This arrangement allows the conductive particles 10 and the conductive nanoparticles 50 to further reliably connect the opposing first electrode 110 and second electrode 114 electrically.

The conductive nanoparticle 50 included in the connection structure 100b may have a spherical shape. The diameter of the conductive nanoparticle 50 may be in a range between a value equal to or larger than $10^{-3}$ μm and a value equal to or smaller than $10^{-1}$ μm. As a material of the conductive nanoparticles 50, any can be selected as appropriate from among known conductive particles for use. As the material of the conductive nanoparticles 50, Ni-based nanoparticles less prone to oxidation and with less migration are preferable, but the material may be Cu-based nanoparticles. The material may be nanoparticles in a core and shell configuration formed of a Cu-based metal as a core and a Ni-based metal as a shell. The diameter and material of the conductive nanoparticle 50 can be selected as appropriate from values in the above-described range, depending on the size and material of the conductive particle 10, the materials and viscosities of the first composite 20' and the second composite 30', the method for manufacturing connection structure, and so forth.

The Method for Manufacturing Connection Structure

A method for manufacturing connection structure according to one embodiment of the present invention is the same as the method for manufacturing connection structure according to the first embodiment except that a mixture of the plurality of conductive particles 10, the plurality of conductive nanoparticles 50, and the first composite 20' is arranged in place of the plurality of conductive particles 10 and the first composite 20'. The same description as that of the first embodiment is omitted, and parts different from the methods for manufacturing connection structure according to the first embodiment are described herein. Also, the present embodiment is not limited to this, and can be applied to the second to fourth embodiments.

The plurality of conductive particles 10, the plurality of conductive s nanoparticles 50, and the first composite 20' are mixed, and are arranged by using an offset printing scheme. Since the mixture of the plurality of conductive particles 10, the plurality of conductive nanoparticles 50, and the first composite 20' contains the conductive particles 10, a pad printing scheme of transferring a printed matter by using a pad is particularly preferable.

As for the concentration of the conductive nanoparticles 50 mixed into the first composite 20', the conductive nanoparticles 50 is preferably in a range between a value equal to or larger than 0.1 weight % and a value equal to or smaller than 10 weight % with respect to a total volume of the plurality of conductive particles 10, the plurality of conductive nanoparticles 50, and the first composite 20'. If the mixing amount of the conductive nanoparticles 50 is smaller than 0.1 weight %, it is difficult to arrange a sufficient number of conductive nanoparticles 50. If the mixing amount of the conductive nanoparticles 50 is larger than 10 weight %, operability is degraded, and it is difficult to arrange the mixture of the plurality of conductive particles 10, the plurality of conductive nanoparticles 50, and the first composite 20'. A method of arranging the mixture of the plurality of conductive particles 10, the plurality of conductive nanoparticles 50, and the first composite 20' is the same as the method of arranging the mixture of the plurality of conductive particles 10 and the first composite 20', and is thus omitted herein.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic component have high fineness and high density.

The present invention is not limited to the above-described embodiments, and can be modified as appropriate in a range not deviating from the gist of the invention. Also, the embodiments can be combined as appropriate.

FIRST EXAMPLE

FIG. 11A and FIG. 11B show an example of a connection structure according to one example of the present invention. FIG. 11A is a diagram of an arrangement pattern of the conductive particles 10 and the first resin 20 of a connection structure according to a first example of the present invention. FIG. 11B is a diagram of an arrangement pattern of the first resin 20 and the second resin 30 of the connection structure according to the first example of the present invention. Parameters of the connection structure of the first example are as follows.

Width (short side) (A1) of the first electrode 110=12 μm
Distance (B1) between the first electrodes 110=9 μm
Pitch (A1+B1=C1) of the first electrode 110=21 μm
Length (long side) (D1) of the first electrode 110=84 μm
Area (A1×D1) of the first electrode 110=1008 μm²
Area of one region where the conductive particles 10 and the first resin 20 are arranged=64 μm²
Total area of regions where the conductive particles 10 and the first resin 20 are arranged per electrode=448 μm²
Number of regions where the conductive particles 10 and the first resin 20 are arranged per electrode=7
Number of conductive particles 10 arranged per region where the conductive particles 10 and the first resin 20 are arranged=3
Number of conductive particles 10 arranged per electrode=21

SECOND EXAMPLE

FIG. 12A and FIG. 12B show an example of a connection structure according to one example of the present invention. FIG. 12A is a diagram of an arrangement pattern of the conductive particles 10 and the first resin 20 of a connection structure according to a second example of the present invention. FIG. 12B is a diagram of an arrangement pattern of the first resin 20 and the second resin 30 of the connection structure according to the second example of the present invention. Parameters of the connection structure of the second example are as follows.

Width (short side) (A2) of the first electrode 110=9 μm
Distance (B2) between the first electrodes 110=6 μm
Pitch (A2+B2=C2) of the first electrode 110=15 μm
Length (long side) (D2) of the first electrode 110=78 μm
Area (A2×D2) of the first electrode 110=702 μm²
Area of one region where the conductive particles 10 and the first resin 20 are arranged=40 μm²
Total area of regions where the conductive particles 10 and the first resin 20 are arranged per electrode=280 μm²
Number of regions where the conductive particles 10 and the first resin 20 are arranged per electrode=7
Number of conductive particles 10 arranged per region where the conductive particles 10 and the first resin 20 are arranged=2
Number of conductive particles 10 arranged per electrode=14

THIRD EXAMPLE

FIG. 13A and FIG. 13B show an example of a connection structure according to one example of the present invention. FIG. 13A is a diagram of an arrangement pattern of the conductive particles 10 and the first resin 20 of a connection structure according to a third example of the present invention. FIG. 13B is a diagram of an arrangement pattern of the first resin 20 and the second resin 30 of the connection structure according to the third example of the present invention. Parameters of the connection structure of the third example are as follows.

Width (short side) (A3) of the first electrode 110=12 μm
Distance (B3) between the first electrodes 110=9 μm
Pitch (A3+B3=C3) of the first electrode 110=21 μm
Length (long side) (D3) of the first electrode 110=105 μm
Area (A3×D3) of the first electrode 110=1260 μm²
Area of one region where the conductive particles 10 and the first resin 20 are arranged=113 μm²
Total area of regions where the conductive particles 10 and the first resin 20 are arranged per electrode=791 μm²
Number of regions where the conductive particles 10 and the first resin 20 are arranged per electrode=7
Number of conductive particles 10 arranged per region where the conductive particles 10 and the first resin 20 are arranged=7
Number of conductive particles 10 arranged per electrode=49

FOURTH EXAMPLE

FIG. 14A and FIG. 14B show an example of a connection structure according to one example of the present invention. FIG. 14A is a diagram of an arrangement pattern of the conductive particles 10 and the first resin 20 of a connection structure according to a fourth example of the present invention. FIG. 14B is a diagram of an arrangement pattern of the first resin 20 and the second resin 30 of the connection structure according to the fourth example of the present invention. Parameters of the connection structure of the fourth example are as follows.

Width (short side) (A4) of the first electrode 110=9 μm
Distance (B4) between the first electrodes 110=6 μm
Pitch (A4+B4=C4) of the first electrode 110=15 μm
Length (long side) (D4) of the first electrode 110=84 μm
Area (A4×D4) of the first electrode 110=756 μm$^2$
Area of one region where the conductive particles 10 and the first resin 20 are arranged=64 μm$^2$
Total area of regions where the conductive particles 10 and the first resin 20 are arranged per electrode=448 μm$^2$
Number of regions where the conductive particles 10 and the first resin 20 are arranged per electrode=7
Number of conductive particles 10 arranged per region where the conductive particles 10 and the first resin 20 are arranged=3
Number of conductive particles 10 arranged per first electrode 110=21

FIFTH EXAMPLE

Figure 15A:
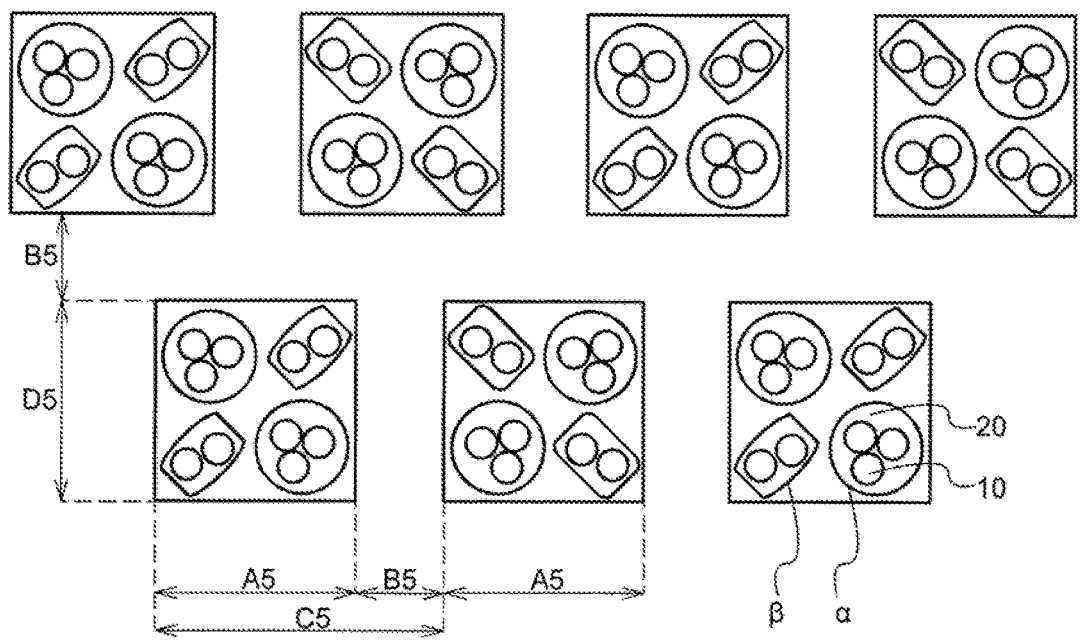
FIG. 15A and FIG. 15B shows an example of the connection structure according to an embodiment of the present invention; and FIG. 16A
Figure 15B:
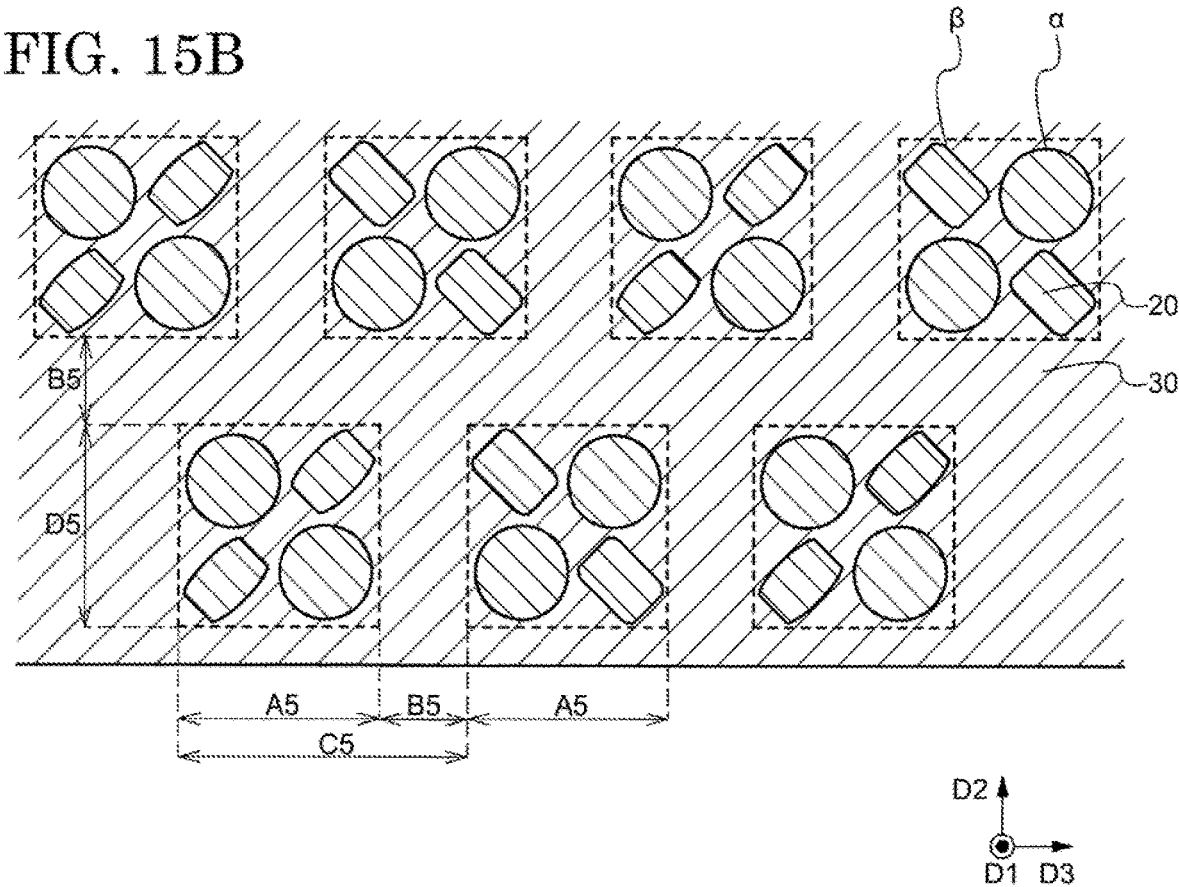

FIG. 15A and FIG. 15B show an example of a connection structure according to one example of the present invention. FIG. 15A is a diagram of an arrangement pattern of the conductive particles 10 and the first resin 20 of a connection structure according to a fifth example of the present invention. FIG. 15B is a diagram of an arrangement pattern of the first resin 20 and the second resin 30 of the connection structure according to the fifth example of the present invention. Parameters of the connection structure of the fifth example are as follows.

Width (short side) (A5) of the first electrode 110=21 μm
Distance (B5) between the first electrodes 110=10 μm
Pitch (A5+B5=C5) of the first electrode 110=31 μm
Length (long side) (D5) of the first electrode 110=21 μm
Area (A5×D5) of the first electrode 110=441 μm$^2$
Area of region α where the conductive particles 10 and the first resin 20 are arranged=64 μm$^2$
Total area of region α where the conductive particles 10 and the first resin 20 are arranged per electrode=128 μm$^2$
Number of region α where the conductive particles 10 and the first resin 20 are arranged per electrode=2
Number of conductive particles 10 arranged per region α where the conductive particles 10 and the first resin 20 are arranged=3
Area of region β where the conductive particles 10 and the first resin 20 are arranged=40 μm$^2$
Total area of region β where the conductive particles 10 and the first resin 20 are arranged per electrode=80 μm$^2$
Number of region β where the conductive particles 10 and the first resin 20 are arranged per electrode=2
Number of conductive particles 10 arranged per region β where the conductive particles 10 and the first resin 20 are arranged=2
Number of conductive particles 10 arranged per electrode=10

SIXTH EXAMPLE

Figure 16A:
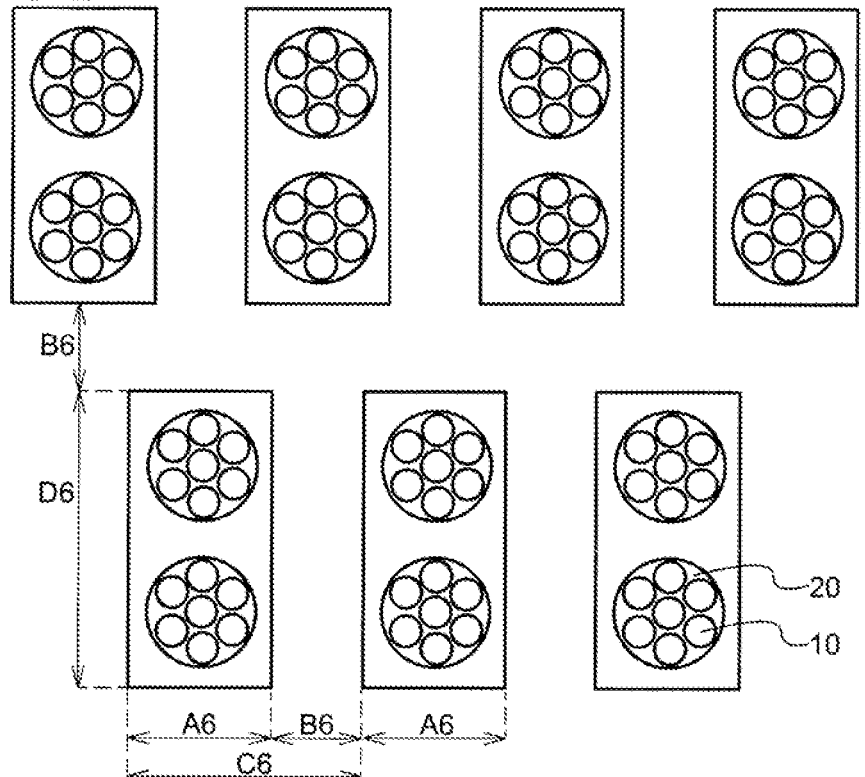
FIG. 16B shows an example of the connection structure according to an embodiment of the present invention.
Figure 16B:
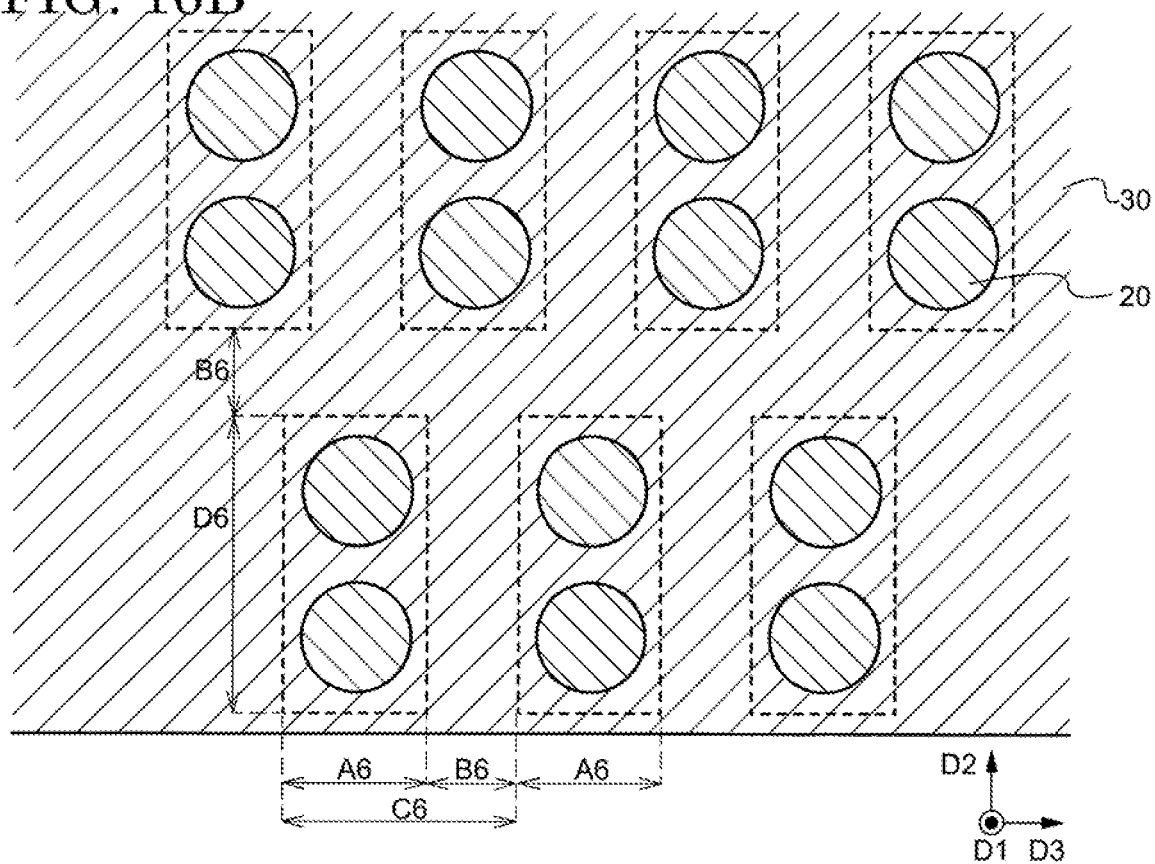

FIG. 16A and FIG. 16B show an example of a connection structure according to one example of the present invention. FIG. 16A is a diagram of an arrangement pattern of the conductive particles 10 and the first resin 20 of a connection structure according to a sixth example of the present invention. FIG. 16B is a diagram of an arrangement pattern of the first resin 20 and the second resin 30 of the connection structure according to the sixth example of the present invention. Parameters of the connection structure of the sixth example are as follows.

Width (short side) (A6) of the first electrode 110=15 μm
Distance (B6) between the first electrodes 110=10 μm
Pitch (A6+B6=C6) of the first electrode 110=25 μm
Length (long side) (D6) of the first electrode 110=30 μm
Area (A6×D6) of the first electrode 110=450 μm$^2$
Area of the region where the conductive particles 10 and the first resin 20 are arranged=113 μm$^2$
Total area of regions where the conductive particles 10 and the first resin 20 are arranged per electrode=226 μm$^2$
Number of regions where the conductive particles 10 and the first resin 20 are arranged=2
Number of conductive particles 10 arranged per region=7
Number of conductive particles 10 arranged per electrode=14

As shown in the first to sixth examples, according to one embodiment of the present invention, even if the electrodes arranged on the electronic components have high fineness and high density, conductivity between opposing electrodes is ensured with simple process, and a short circuit between adjacent electrodes can be reduced.

What is claimed is:

1. A method for manufacturing connection structure, the method comprising:
   arranging conductive particles and a first composite on a first electrode located on a first surface of a first member, each of the conductive particles comprising a particle core having elasticity coated with metals;
   arranging a second composite on a region other than the first electrode of the first surface;
   arranging the first surface and a second surface of a second member where a second electrode is located, so that the first electrode and the second electrode are opposed to each other; and
   curing the first composite and the second composite simultaneously while pressing the first member and the second member until the conductive particles are deformed,
   wherein the second composite contains an ene/thiol-based curable resin containing an ethylene unsaturated compound and a thiol compound, and a curable component of at least one of the ethylene unsaturated compound and the thiol compound is a 9,9-bisarylfluorene compound.

2. The method according to claim 1, wherein the second composite is arranged on a region other than the second electrode located on a second surface of a second member instead of arranging on the first surface.

3. The method according to claim 1, wherein the conductive particles and the first composite are arranged at least seven and more the conductive particles per 400 μm$^2$ of an area of the first electrode.

4. The method according to claim 1, wherein the conductive particles and the first composite are arranged using an offset printing scheme.

5. The method according to claim 1, wherein the conductive particles and the first composite are arranged using a pad printing scheme.

6. The method according to claim 5, wherein a planographic intaglio plate is used for the pad printing.

7. The method according to claim 1, wherein the first composite has a viscosity higher than a viscosity of the second composite.

8. The method according to claim 1, wherein the conductive particles are mixed in the first composite in a range between a value equal to or larger than 20 volume % and a value equal to or smaller than 60 volume %.

9. The method according to claim 1, wherein the first composite contains conductive nanoparticles.

10. The method according to claim 1, wherein the first composite and the second composite contain a radical-polymerization resin.

11. The method according to claim 1, wherein the first composite and the second composite contain a photocuring initiating component.

12. The method according to claim 1, wherein the first composite and the second composite are cured by light irradiation.

13. The method according to claim 1, wherein the first composite and the second composite contain a shielding part curing activation compound.

14. The method according to claim 1, wherein the first composite contains an anaerobic curing initiating component.

15. The method according to claim 1, wherein the second composite contains an insulating particles.

16. The method according to claim 1, wherein the pressure causes the conductive particles to make contact with the first electrode and the second electrode.

* * * * *